United States Patent [19]
Gaudiana et al.

[11] Patent Number: 6,004,719
[45] Date of Patent: Dec. 21, 1999

[54] IMAGING MEDIUM AND PROCESS FOR PRODUCING AN IMAGE

[75] Inventors: Russell A. Gaudiana, Merrimack, N.H.; Robert W. Haddock, Pembroke, Mass.; Serajul Haque, Braintree, Mass.; Iris B. Kliman Bloom, Waltham, Mass.; John L. Marshall, Somerville, Mass.; Socorro M. Ramos, North Andover, Mass.; Larry C. Takiff; Stephen J. Telfer, both of Arlington, Mass.; Michael A. Young, Natick, Mass.

[73] Assignee: Polaroid Corporation, Cambridge, Mass.

[21] Appl. No.: 08/858,659

[22] Filed: May 19, 1997

Related U.S. Application Data

[63] Continuation-in-part of application No. 08/430,420, Apr. 28, 1995, Pat. No. 5,631,118, which is a continuation-in-part of application No. 08/232,725, Apr. 25, 1994, Pat. No. 5,441,850.

[51] Int. Cl.$^6$ .......................... G03C 1/492; G03C 1/494; G03C 1/76

[52] U.S. Cl. .......................... 430/270.1; 430/11; 430/17; 430/332; 430/333; 430/335; 430/336; 430/338; 430/340; 430/343; 430/346; 430/348; 430/496

[58] Field of Search .............................. 430/11, 17, 332, 430/333, 338, 496, 335, 336, 340, 343, 346, 348

[56] References Cited

U.S. PATENT DOCUMENTS 5,578,424  11/1996  Grasshoff et al. ..................... 430/333
5,741,630   4/1998  Marshall et al. ....................... 430/337

*Primary Examiner*—Geraldine Letscher
*Attorney, Agent, or Firm*—David J. Cole

[57] ABSTRACT

A process for producing an image uses an imaging medium comprising an acid-generating layer or phase comprising a mixture of a superacid precursor, a sensitizing dye and a secondary acid generator, and a color-change layer comprising an image dye. The sensitizing dye has first and second forms, the first form having substantially greater substantial absorption in a first wavelength range than the second form. The superacid precursor is not capable, in the absence of the first form of the sensitizing dye, of being decomposed by radiation in the first wavelength range. The secondary acid generator is capable of thermal decomposition, catalyzed by superacid, to form a secondary acid. While at least part of the sensitizing dye is in its first form, the medium is imagewise exposed to radiation in the first wavelength range, thereby causing, in the exposed areas of the acid-generating layer, the formation of superacid. The medium is then heated to cause, in the exposed areas, thermal decomposition of the secondary acid generator, catalyzed by the superacid, and formation of the secondary acid. The components of the acid-generating and color-change layers or phases are then mixed so that the secondary acid causes a change in color of the image dye, and the sensitizing dye is converted to its second form. The acid-generating layer or phase desirably includes a cosensitizer which is a reducing agent less basic than the secondary acid generator.

29 Claims, 6 Drawing Sheets

IMAGING MEDIUM AND PROCESS FOR PRODUCING AN IMAGE

REFERENCE TO RELATED APPLICATIONS

This application is a continuation-in-part of our application Ser. No. 08/430,420, filed Apr. 28, 1995 (now U.S. Pat. No. 5,631,118), which in turn is a continuation-in-part of application Ser. No. 08/232,725, filed Apr. 25, 1994 (now U.S. Pat. No. 5,441,850).

Attention is also directed to copending application Ser. No. 08/757,195, filed Nov. 27, 1996, and assigned to the same assignee as the present application; the entire disclosure of this copending application is herein incorporated by reference.

BACKGROUND OF THE INVENTION

This invention relates to an imaging medium and to a process for producing an image.

Images can be generated by exposing a photosensitive medium to light in an imagewise fashion. Some conventional non-silver halide photosensitive compositions contain molecules which are inherently photosensitive, so that absorption of electromagnetic radiation brings about decomposition of, at most, as many molecules as photons absorbed. However, a dramatic increase in the sensitivity of such photosensitive compositions can be achieved if the absorption of each photon generates a catalyst for a secondary reaction which is not radiation-dependent and which effects conversion of a plurality of molecules for each photon absorbed. For example, systems are known in which the primary photochemical reaction produces an acid, and this acid is employed catalytically to eliminate acid-labile groups in a secondary, radiation-independent reaction. Such systems may be used as photoresists: see, for example, U.S. Pat. Nos. 3,932,514 and 3,915,706; and Ito et al., "Chemical Amplification in the Design of Dry Developing Resist Materials", Polym. Sci. Eng., 23(18), 1012 (1983).

Among the known acid-generating materials for use in this type of process employing secondary, non-radiation dependent reactions are certain diazonium, phosphonium, sulfonium and iodonium salts. These salts, hereinafter referred to as superacid precursors, decompose to produce superacids, i.e., acids with a pKa less than about 0, upon exposure to electromagnetic radiation. Other materials decompose to produce superacids in a similar manner. However, in the absence of a spectral sensitizer, the known superacid precursors decompose to produce superacid only upon exposure to wavelengths which the precursors absorb, which are typically in the ultraviolet region (below about 330 nm). The use of such wavelengths is often inconvenient, not least because special optical systems must be used.

It is known that various dyes can sensitize the decomposition of superacid precursors upon absorption by the dye of radiation which is not significantly absorbed by the superacid precursor; see, for example, European Patent Application Publication No. 120,601. Unfortunately, however, due to the very low pKa of the superacid, many such dyes are protonated by the superacid, so that no unbuffered superacid is produced (i.e., the sensitizing dye buffers any superacid produced). Since no unbuffered superacid is released into the medium, decomposition of superacid precursors sensitized by these dyes cannot be used to trigger any secondary reaction which requires the presence of unbuffered superacid.

(The term "unbuffered superacid" is used herein to refer to superacid which is not buffered by the sensitizing dye, and which thus provides an acidic species stronger than that provided by the protonated sensitizing dye. Because of the extreme acidity of superacids and their consequent tendency to protonate even species which are not normally regarded as basic, it is possible, and indeed likely, that "unbuffered superacid" will in fact be present as a species buffered by some component of the imaging medium less basic than the sensitizing dye. However, such buffering by other species may be ignored for present purposes, so long as superacid is present as a species sufficiently acidic to trigger the generation of secondary acid.)

Crivello and Lam, "Dye-Sensitized Photoinitiated Cationic Polymerization", J. Polymer Sci., 16, 2441 (1978) and Ohe and Ichimura, "Positive-Working Photoresists Sensitive to Visible Light III, Poly(tetrahydropyranyl methacrylates) Activated by Dye-Sensitized Decomposition of Diphenyliodonium Salt", J. Imag. Sci., Technol., 37(3), 250 (1993) describe small sub-groups of sensitizing dyes which are sufficiently non-basic that the buffered superacids produced can effect certain acid-catalyzed reactions. However, the need to restrict the choice both of sensitizers and of acid-catalyzed reactions may make it difficult to design an efficient imaging system at a specific desired wavelength.

A variety of non-basic, polycyclic aromatic compounds sensitize decomposition of superacid precursors to produce unbuffered superacid upon exposure to longer wavelengths than the superacid precursors absorb themselves. Such materials are discussed in, for example, DeVoe et al., "Electron Transfer Sensitized Photolysis of 'Onium salts", Can. J. Chem., 66, 319 (1988); Saeva, U.S. Pat. No. 5,055,376; and Wallraff et al., "A Chemically Amplified Photoresist for Visible Laser Imaging", J. Imag. Sci. Technol., 36(5), 468–476 (1992).

U.S. application Ser. No. 08/141,852, filed Oct. 22, 1993 (now U.S. Pat. No. 5,453,345) and its parent, U.S. Pat. No. 5,286,612 (both assigned to the same assignee as the present invention) describe a process by which a wider variety of dyes than those discussed above may be used together with a superacid precursor to generate free (unbuffered) superacid in a medium. In this process, acid is generated by exposing a mixture of a superacid precursor and a dye to actinic radiation of a first wavelength which does not, in the absence of the dye, cause decomposition of the superacid precursor to form the corresponding superacid, thereby causing absorption of the actinic radiation and decomposition of part of the superacid precursor, with formation of a protonated product derived from the dye; then irradiating the mixture with actinic radiation of a second wavelength, thereby causing decomposition of part of the remaining superacid precursor, with formation of free superacid. Generation of superacid by exposure to the second wavelength may be sensitized by one of the non-basic, polycyclic aromatic sensitizers mentioned above. (For convenience, the type of process disclosed in this patent will hereinafter be called the '612 process.)

However, the use of any of the methods described above for the sensitized decomposition of superacid precursors to generate unbuffered superacid poses a severe problem if the exposing wavelength for the imaging system falls within a wavelength range in which the resultant image is to be viewed, and the sensitizing dye is not removed. This problem will hereinafter be referred to as the "sensitizing/viewing problem," and is particularly apparent when one attempts to use one of the sensitizers described above to make an image, intended to be viewed by the eye, by means of an exposure to visible wavelengths. Absorption of visible light by the sensitizer leads to a large minimum optical density ($D_{min}$) in the final image, lowering its contrast and making its appearance unacceptable (especially in regions intended to be white, that is diffusely reflective, and non-absorbing in the visible region). Even if the visible absorption of the sensitizer is bleached in the course of the sensitization reaction, this visible absorption will still remain in the originally non-exposed areas of the image. The sensitizing/viewing problem is not confined to visible wavelengths but applies to any system in which the exposing radiation absorbed by the sensitizer falls within a wavelength range in which the resultant image is to be viewed or used (in the case of a photomask or photographic negative). For example, in the graphic arts industry, it is conventional to expose contact and "dupe" films in the near ultra-violet to produce photomasks which display imagewise changes in absorption which are themselves in the near ultra-violet range. Such processes, if sensitized by one of the methods described above, may suffer from a sensitizing/viewing problem.

The sensitizing/viewing problem is especially severe if it is desired to construct a full-color imaging system, which requires exposure to at least three different wavelengths to produce images in three primary colors. A conventional approach to this problem would be to resort to "false sensitization", i.e., to expose the imaging medium at three wavelengths which are not visible to the eye. In practice, however, exclusion of visible wavelengths for exposure leads to great difficulty.

Efficient sensitization of superacid precursors at non-visible wave-lengths is limited to the near ultra-violet region (between about 330 nm and 420 nm) and the near infra-red region (between about 700 nm and 1200 nm). The non-basic, polycyclic aromatic compounds mentioned above may be used to sensitize decomposition of superacid precursors to make unbuffered superacid in the near ultra-violet region. However, it is difficult to find three near ultra-violet wavelengths which can be generated by a convenient source and which are sufficiently separated from each other to be absorbed by three sensitizers without cross-talk among three color-forming layers. (The practical near ultra-violet wavelength range for this type of imaging process extends only from about 330 nm to about 420 nm, since other components of the imaging medium, such as leuco image dyes if used, often absorb competitively with the sensitizer below about 330 nm, and wavelengths above about 420 nm will appear yellow to the human eye). It is difficult to find a lamp which emits three spaced wavelengths in the 330–420 nm range; a conventional mercury lamp emits only two usable wavelengths in this range. Moreover, a modulating device such as a liquid crystal cell (and polarizers, if required) may be damaged by lengthy exposure to near ultra-violet radiation. Although phosphors emitting in the near ultra-violet are known, cathode ray tubes using such phosphors must be custom-made, and the emission spectra of such phosphors are often broad, leading to possible cross-talk. Another available exposure source, the near ultra-violet laser, is expensive.

Although it may at first appear that sensitization at near infra-red wavelengths would solve the problems discussed above, infra-red sensitizers suffer from other problems. Some near infra-red dyes, and all non-basic polycyclic aromatic compounds which absorb in the near infra-red, have visible absorptions which contribute to the $D_{min}$ of the image. Equally importantly, the photon energy in the near infra-red is less than about 40 kcal/mole, and in practice this low photon energy appears to limit the quantum efficiency at which the sensitizing dye causes the decomposition of the superacid precursor. This limited quantum efficiency limits the overall sensitivity of the process.

The problems discussed above are alleviated if at least one of the exposing wavelengths is in the visible region. If at least one exposing wavelength is in the visible or near infra-red region, a maximum of only two exposing wavelengths must be found in the near ultra-violet. Furthermore, the higher photon energy available in the visible region, as compared with the near infra-red, is likely to lead to higher quantum efficiency, and therefore higher sensitivity, than can be expected from near infra-red exposure. There are also other reasons why exposure in the visible region is preferred. Conventional cameras are designed to use visible light, and thus any medium intended to replace conventional silver halide film in cameras must use visible light to produce a visible image. Likewise, any medium intended to produce a print from a photographic negative must be capable of exposure by visible light. Conventional photographic printers, also, are designed to use visible light. Much effort has been expended in developing sources (for example, light-emitting diodes, cathode ray tubes, lamps and lasers) and control devices (for example, liquid crystal light valves) optimized for visible radiation. Accordingly, using visible radiation rather than (say) infra-red or ultra-violet radiation in an imaging process often enables the cost of the imaging apparatus to be reduced, and may also make it possible to use a standard, commercially available light source or control device rather than a custom-made source or device.

U.S. Pat. No. 5,334,489 and copending U.S. application Ser. No. 08/141,860 (now U.S. Pat. No. 5,395,736; both these patents are assigned to the same assignee as the present application), and the corresponding International Application No. PCT/US93/10224 (Publication No. WO 94/10607), all describe processes for the photochemical generation of acid and for imaging using conventional ultra-violet sensitizers; these processes will hereinafter collectively be called the "'489 process." The aforementioned U.S. Pat. No. 5,286,612 and copending application Ser. No. 08/141,852, and the corresponding International Application No. PCT/US93/10215 (Publication No. WO 94/10606), all describe an imaging process using an imaging medium comprising an acid-generating layer or phase and a color-change layer or phase. In this patent and these applications, the acid-generating layer or phase comprises a mixture of a superacid precursor, a sensitizer and a secondary acid generator. The secondary acid generator is capable of thermal decomposition, catalyzed by unbuffered superacid, to form a secondary acid. The color-change layer comprises an image dye which undergoes a change in its absorption of radiation upon contact with the secondary acid. After imagewise exposure and generation of unbuffered superacid in the exposed areas, the medium is heated; in exposed areas, the unbuffered superacid causes acid-catalyzed decomposition of the secondary acid generator, thereby causing the formation of a molar amount of secondary acid much larger than the molar amount of unbuffered superacid present before the heating. In the non-exposed areas, however, since no unbuffered superacid is present, no significant generation of secondary acid takes place during the heating. Thereafter, the medium is further heated (in practice the two heating steps can be combined) to cause the components present in the two layers to mix, so that, in exposed areas, the secondary acid brings about the absorption change in the image dye, thereby forming an image. Thus, the imaging medium is a single sheet which develops its image without any need for treatment with a developing composition and without requiring any waste material to be peeled from the medium to produce the final image.

In these processes, the sensitizer or sensitizers and the undecomposed superacid precursor remain present in at least the non-exposed areas of the medium after imaging (these non-exposed areas are the $D_{min}$ areas, i.e., the regions of minimum optical density, in the normal case where the image dye is colorless before imaging and develops color in the exposed areas during imaging). Accordingly, in practice it is necessary that the image be viewed in a wavelength range which does not include the wavelength used for the imagewise exposure, since otherwise the image will suffer from a sensitizing/viewing problem, with the contrast between the exposed and non-exposed areas reduced by the absorption, in the non-exposed areas, of the sensitizer or sensitizers used. For example, as discussed above, the preferred '612 process requires two exposures, one at a wavelength in the near infra-red region (700–1200) nm and the second at a wavelength in the near ultra-violet region, typically around 365 nm, to produce an image in the visible region (about 400–700 nm).

There is a need for a modified form of these imaging media and processes which removes the restriction that the wavelength used for the imagewise exposure be outside the wavelength range in which the final image is viewed.

SUMMARY OF THE INVENTION

This invention provides a process for producing an image. This process uses an imaging medium comprising an acid-generating layer or phase comprising a mixture of a superacid precursor, a sensitizing dye and a secondary acid generator, and a color-change layer or phase comprising an image dye. The sensitizing dye has a first form and a second form, the first form having substantially greater absorption in a first wavelength range than the second form. The superacid precursor is not, in the absence of the first form of the sensitizing dye, capable of being decomposed to produce a superacid by actinic radiation in the first wavelength range. The secondary acid generator is capable of thermal decomposition, catalyzed by the superacid, to form a secondary acid. The image dye undergoes a change in its absorption of radiation upon contact with the secondary acid. In the present process, while at least part of the sensitizing dye is in its first form, the medium is imagewise exposed to actinic radiation in the first wavelength range. In the exposed areas of the acid-generating layer or phase, this imagewise exposure causes the sensitizing dye to decompose at least part of the superacid precursor, with formation of superacid. Thereafter, the medium is heated to cause, in the exposed areas of the acid-generating layer or phase, thermal decomposition of the secondary acid generator, catalyzed by the superacid, and formation of the secondary acid. Next, the components of the acid-generating and color-change layers or phases are mixed, thereby causing, in the exposed areas of the medium, the secondary acid to bring about the change in absorption of the image dye and thereby form the image. Finally, in at least the non-exposed areas of the medium, the sensitizing dye is converted to its second form.

This invention also provides an imaging medium as defined in the preceding paragraph.

DETAILED DESCRIPTION OF THE INVENTION

Figure 1A:
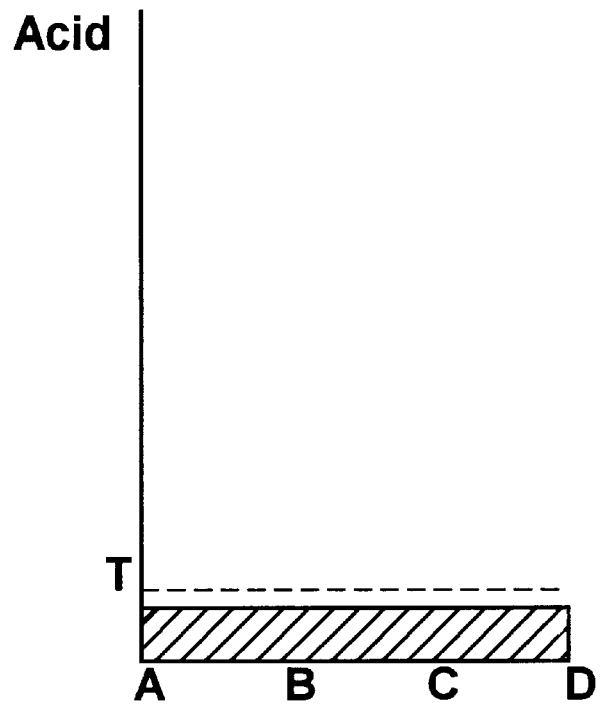
FIG. 1A–1D show the acid concentrations in the exposed and non-exposed regions of the acid-generating layer during the various steps of a first preferred process of the present invention.

The process of the present invention differs from the '489 and '612 processes in that the present process uses a sensitizing dye having a first form and a second form, with the first form having substantially greater absorption in a specific wavelength range (herein called the "first wavelength range") than the second form. The medium is imagewise exposed to radiation in the first wavelength range while the sensitizing dye is in its first form, so that, in the exposed areas, the sensitizing dye causes decomposition of at least part of the superacid precursor, with formation of superacid. As explained in more detail below, in some cases, in addition to the imagewise exposure, further steps may be necessary to produce the imagewise distribution of superacid required for later steps of the present process.

The superacid in the exposed areas (in effect, a "latent image" in superacid) produced in the first part of the present process is then used to cause superacid-catalyzed thermal decomposition of the secondary acid generator, and for this purpose the imaging medium is heated. Next, the components of the acid-generating and color-change layers or phases are mixed, thereby causing, in the exposed areas of the medium, the secondary acid to bring about the change in absorption of the image dye and to form the image. (In saying that the components of the acid-generating and color-change layers or phases are mixed, we do not exclude the possibility that these two layers or phases may be merged to form a single layer or phase, but such complete merger is not necessary, since it is only necessary for the secondary acid and the image dye to come into contact, so that the secondary acid can cause the change in absorption of the image dye.) Finally, in at least the non-exposed areas of the imaging medium, the sensitizing dye is converted to its second form. This conversion of the sensitizing dye to its second form essentially removes from the non-exposed areas of the image the absorption of the sensitizing dye in the first wavelength range, and thus allows the imagewise exposure of the medium to be effected using radiation in the same wavelength range as that in which the image is viewed; at least the non-exposed areas of the final image do not absorb at the wavelength at which imaging is effected.

Conversion of the sensitizing dye from its first to its second form may be effected by any technique capable of converting a dye from a first form having a substantial absorption in the desired wavelength range to a second form having substantially less absorption in this wavelength range. However, this conversion should be such as not to adversely affect the image, either by significantly decreasing the maximum optical density ($D_{max}$) of the exposed regions or by introducing unwanted color into the regions where the sensitizing dye finally remains in its second form. In addition, of course, the sensitizing dye should be chosen so that it is compatible with the other components of the imaging medium and does not, for example, crystallize out on prolonged storage or undergo slow thermal reactions with other components of the imaging medium during such storage.

The conversion of the sensitizing dye from its first form to its second form may be either a reversible or an irreversible chemical reaction. (In theory, no chemical reaction is thermodynamically completely irreversible; however, as any chemist is aware, there are many reactions where the equilibrium lies so far to one side that no detectable trace of the other supposed components of the equilibrium mixture are present, and the term "irreversible" is used herein to mean such reactions which are for practical purposes irreversible.) For example, conversion of the first form of the sensitizing dye to the second form may be effected by contacting the sensitizing dye with a base; in a preferred variant of the present process of this type (hereinafter called the "deprotonation process"), the first form of the sensitizing dye is a protonated form and the second form is a deprotonated form, and the two forms are reversibly interconverted by contact with base or acid. Alternatively, conversion of the first form of the sensitizing dye to the second form may be effected by reacting the sensitizing dye with a nucleophile; this variant of the present process is hereinafter called the "nucleophile process". In such a process, the chemical change effected by the nucleophile may be irreversible. Other techniques for converting a first form of the sensitizing dye to its second form may also be used, for example heating the imaging medium to cause thermal decomposition of the sensitizing dye, or bringing about decomposition of the sensitizing dye by exposing the imaging medium to actinic radiation of a wavelength which does not affect the other components of the medium.

The imaging media of the invention described thus far still contain, after imaging, a substantial amount of unchanged superacid precursor, and are thus susceptible to post-imaging color changes caused by unwanted generation of superacid by ambient radiation striking the superacid precursor, with consequent generation of acid. However, this susceptibility of the imaged media to unwanted color generation can be eliminated by including in the media a "fixing" reagent capable of destroying the superacid precursor, thus fixing the image. Such fixing reagents, and processes for their use, are described and claimed in copending application Ser. No. 08/232,757, and its continuation-in-part, application Ser. No. 08/430,421 (now U.S. Pat. No 5,582,956; this application and patent are both assigned to the same assignee as the present application). The preferred embodiments of the invention described below with reference to Tables 1 and 2 and the accompanying drawings contain such a fixing reagent.

In the present process, the imagewise exposure is effected with at least part of the sensitizing dye in its first form. The imaging medium may be prepared with at least part of the sensitizing dye already its first form; for example in a deprotonation process, an appropriate amount of acid may be included in a coating solution from which the acid-generating layer is deposited, or this coating solution may be contacted with a separate phase containing an acid. Alternatively, the imaging medium may be prepared with the sensitizing dye in its second or some other precursor form, and converted to its first form within the acid-generating layer before the imagewise exposure is effected; for example, as illustrated below with reference to FIGS. 1A–1D and 2A–2E, in a deprotonation process, the imaging medium may be prepared with the sensitizing dye in its deprotonated (second) form and this deprotonated form converted to the protonated (first) form prior to the imagewise exposure by generating or introducing acid into the acid-generating layer. Such acid generation is conveniently effected by exposing the whole of the acid-generating layer to radiation of the second wavelength, with consequent formation of superacid from the superacid precursor, and protonation of at least part of the sensitizing dye. A combination of these two methods of providing acid may of course be used, i.e., one could coat a limited amount of sensitizing dye in its first form and generate additional sensitizing dye in its first form immediately before use.

To illustrate the complex chemical reactions which may take place during the present process, two preferred deprotonation processes of the present invention will now be described, with reference to Tables 1 and 2 below and FIGS. 1A–1D and 2A–2E of the accompanying drawings.

Table 1 and FIGS. 1A–1D of the accompanying drawings show the changes in acid concentration in exposed and non-exposed areas of the acid-generating layer used at various stages during the first preferred deprotonation process. The last section of Table 1, headed "AFTER FIXING," shows the composition of the combined acid-generating and color-change layers after the components thereof have become intermixed.

TABLE 1

| EXPOSED AREA | | NON-EXPOSED AREA | |
|---|---|---|---|
| Component | Moles | Component | Moles |
| PRIOR TO USE | | | |
| [S-DYE] | 1 | [S-DYE] | 1 |
| Secondary acid generator | 10 | Secondary acid generator | 10 |
| $Ph_2I^+SbF_6^-$ | 5 | $Ph_2I^+SbF_6^-$ | 5 |
| AFTER INITIAL ULTRA-VIOLET EXPOSURE | | | |
| $[S-DYE-H]^+SbF_6^-$ | 0.75 | $[S-DYE-H]^+SbF_6^-$ | 0.75 |
| [S-DYE] | 0.25 | [S-DYE] | 0.25 |
| Secondary acid generator | 10 | Secondary acid generator | 10 |
| $Ph_2I^+SbF_6^-$ | 4.25 | $Ph_2I^+SbF_6^-$ | 4.25 |
| AFTER IMAGEWISE VISIBLE EXPOSURE | | | |
| $[S-DYE-H]^+SbF_6^-$ | 0.25 | $[S-DYE-H]^+SbF_6^-$ | 0.75 |
| $Ph-[S-DYE-H]^+SbF_6^-$ | 0.75 | [S-DYE] | 0.25 |
| $HSbF_6$ | 0.5 | Secondary acid generator | 10 |
| Secondary acid generator | 10 | $Ph_2I^+SbF_6^-$ | 4.25 |
| $Ph_2I^+SbF_6^-$ | 3.5 | | |
| AFTER HEATING | | | |
| $[S-DYE-H]^+SbF_6^-$ | 0.25 | $[S-DYE-H]^+SbF_6^-$ | 0.75 |
| $Ph-[S-DYE-H]^+SbF_6^-$ | 0.75 | [S-DYE] | 0.25 |
| $HSbF_6$ | 0.5 | Secondary acid generator | 10 |
| Secondary acid | 10 | $Ph_2I^+SbF_6^-$ | 4.25 |
| $Ph_2I^+SbF_6^-$ | 3.5 | | |
| AFTER FIXING | | | |
| [S-DYE] | 0.25 | [S-DYE] | 1 |
| Ph-[S-DYE] | 0.75 | HOAc | 0.75 |
| HOAc | 6 | KOAc | 1 |
| Image dye/secondary acid salt | 5.5 | Secondary acid generator | 10 |
| | | Cu reagent | 1 |
| Unprotonated image dye | 1 | PhOAc | 4.25 |
| Ph-image dye/secondary acid salt | 3.5 | Unprotonated image dye | 10 |
| | | $KSbF_6$ | 5 |
| Cu reagent | 1 | | |
| $KSbF_6$ | 5 | | |
| K/secondary acid salt | 1 | | |

As shown in Table 1, the imaging medium initially contains the sensitizing dye in its unprotonated form. Both the exposed and non-exposed areas comprise a quantity (shown in Table 1 as 1 mole for simplicity; all references to moles concerning Tables 1 and 2 (see below) refer to moles per unit area of the imaging medium, and are only by way of illustration, since the proportions of the various components may vary widely) of a sensitizing dye, a larger molar quantity of a superacid precursor (5 moles of $Ph_2I^+SbF_6^-$ are shown in Table 1; a suitable quantity of a non-basic polycyclic aromatic sensitizer, such as pyrene, is also included in the medium but is not shown in Table 1) and a still larger molar quantity (10 moles are shown in Table 1) of a secondary acid generator.

The imaging medium is first blanket irradiated with radiation in the second wavelength range, typically near ultra-violet radiation, the amount of radiation applied being sufficient to cause the decomposition of less than one mole (0.75 mole is used for illustration in Table 1 and FIG. 1A) of the superacid precursor, thus producing a corresponding amount of superacid. This superacid immediately protonates the sensitizing dye, producing a salt of the dye shown as "[S-DYE-H]$^+$SbF$_6^-$" in Table 1, and leaving no unbuffered superacid present in the acid-generating layer. Thus, after this initial ultra-violet exposure, as shown in Table 1, all areas of the acid-generating layer contain 0.75 mole of the sensitizing dye salt, 0.25 mole of unprotonated sensitizing dye, 4.25 moles of superacid precursor and 10 moles of secondary acid generator. This situation is illustrated in FIG. 1A, which shows the acid level as 0.75 times a threshold level (indicated by T in FIGS. 1A–1D) at which all the sensitizing dye becomes protonated.

(The secondary reactions that follow the fragmentation of the superacid precursor are not entirely understood at present. However, it is likely that a phenyl radical is generated, which subsequently becomes attached to the radical cation derived from the non-basic polycyclic aromatic sensitizer, following which elimination of a proton occurs. This phenyl radical is ignored in Table 1. Even if some of the phenyl radicals generated do become attached to sensitizing dye molecules, this will not significantly affect the overall course of the process shown in Table 1 and FIG. 1, since a phenylated form of the sensitizing dye would be expected to undergo the same type of protonation and deprotonation reactions, with similar absorption shifts, as the non-phenylated dye.)

Figure 1B:
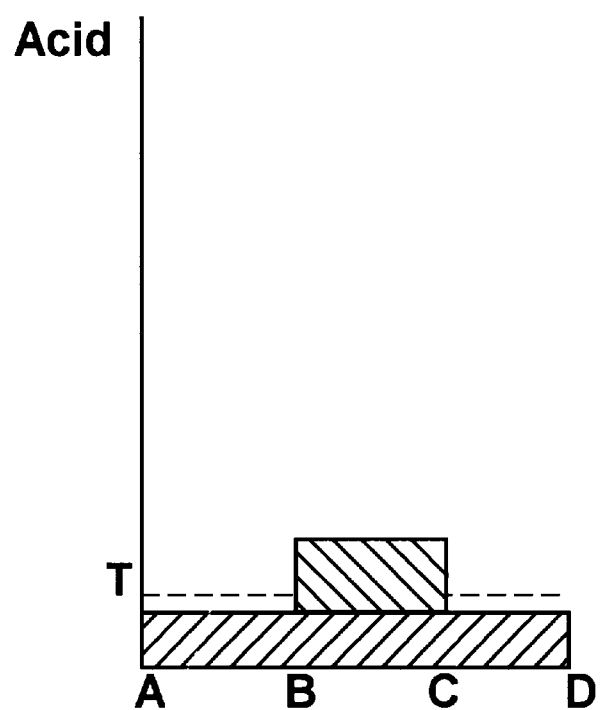

After the initial ultra-violet exposure, the imaging medium is imagewise exposed to radiation in the first wavelength range; visible radiation is shown for illustration in Table 1. As shown in Table 1 and FIG. 1B, in the area BC of the acid-generating layer which is exposed to the visible radiation, this visible radiation causes the protonated sensitizing dye to bring about the decomposition of a further 0.75 mole of superacid precursor, with generation of a further 0.75 mole of superacid, so that the total amount of acid present exceeds the threshold T. The additional superacid generated by the visible exposure protonates the remaining 0.25 mole of previously unprotonated sensitizing dye, leaving 0.5 mole of unbuffered superacid in the exposed area BC, as shown in FIG. 1B. (For purposes of illustration, FIG. 1B shows the acid generated in the ultraviolet and visible exposures separately, although of course no difference exists chemically.) In the non-exposed areas AB and CD no change in the acid level occurs, the acid concentration remains below the threshold T, and no unbuffered superacid is present after the visible exposure.

Thus, at the end of the imagewise irradiation, unbuffered superacid is present in the exposed areas, whereas in the non-exposed areas no unbuffered superacid is present, all the superacid generated being buffered by the sensitizing dye. In effect, the acid-generating layer now contains a "latent image" in superacid, although this image is not visible to the human eye.

It is expected that the decomposition of the superacid precursor by the sensitizing dye during the imagewise visible exposure will be accompanied by phenylation of the photooxidized sensitizing dye by the phenyl radical derived from the superacid precursor, followed by elimination of a proton. Accordingly, at the end of the imagewise exposure, the exposed areas will contain 0.75 mole of a phenylated product derived from the protonated sensitizing dye, this product being denoted Ph-[S-DYE-H]$^+$SbF$_6^-$ in Table 1. The remaining 0.25 mole of sensitizing dye will remain in the [S-DYE-H]$^+$SbF$_6^-$ form. Also present in the exposed areas will be 0.5 mole of unbuffered superacid, the 3.5 remaining moles of superacid precursor, and the 10 moles of secondary acid generator, which remain unchanged at this point. (The composition of the non-exposed areas of course remains unchanged by the imagewise visible exposure.)

Figure 1C:
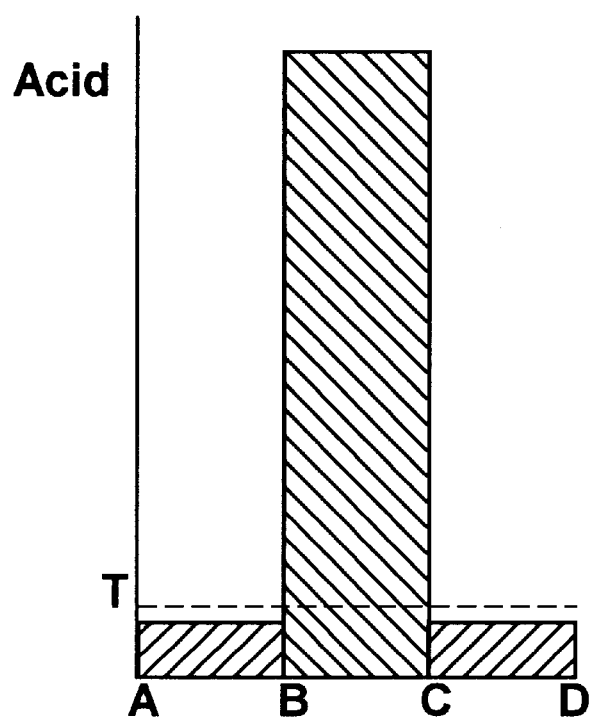

The imaging medium is next heated. In the exposed area BC, the unbuffered superacid present catalyzes the decomposition of the secondary acid generator, thus producing a large quantity of the secondary acid (10 moles are shown by way of example in Table 1; FIG. 1C is not strictly to scale). However, in the non-exposed areas AB and CD, no unbuffered superacid is present, and the sensitizing dye/superacid salt does not catalyze the decomposition of the secondary acid generator, so that essentially no decomposition of the secondary acid generator occurs and essentially no secondary acid is generated.

In the final step of the process, as discussed in more detail below, the components of the acid-generating and color change layers become intermixed. Table 1 assumes that the color-change layer contains 10 moles of an indicator image dye, 1 mole of copper compound, 1 mole of a reducing agent (the products produced by oxidation of this reducing agent are ignored in Table 1 for simplicity) and 6 moles of a reactive material, shown as potassium acetate in Table 1 (where acetate is abbreviated "OAc"). Table 1 further assumes that the image dye is more basic than the sensitizing dye; the contrary case is discussed below following Table 2. In the non-exposed areas, the copper compound, the reducing agent and the reactive material decompose all remaining superacid precursor, with generation of the corresponding amount of phenyl acetate (Table 1 assumes), phenyl iodide (omitted from Table 1) and potassium hexafluoroantimonate. In the exposed areas, the potassium acetate is protonated by the superacid and by some of the secondary acid. The copper reagent catalyzes decomposition of the remaining superacid precursor with the formation of phenyl cations, which react with the most nucleophilic species remaining, here assumed to be the image dye. (In practice, the decomposition of the superacid precursor is probably somewhat more complicated, and other products may be produced; however, the exact type of decomposition products produced does not affect the essential nature of the present process.)

Figure 1D:
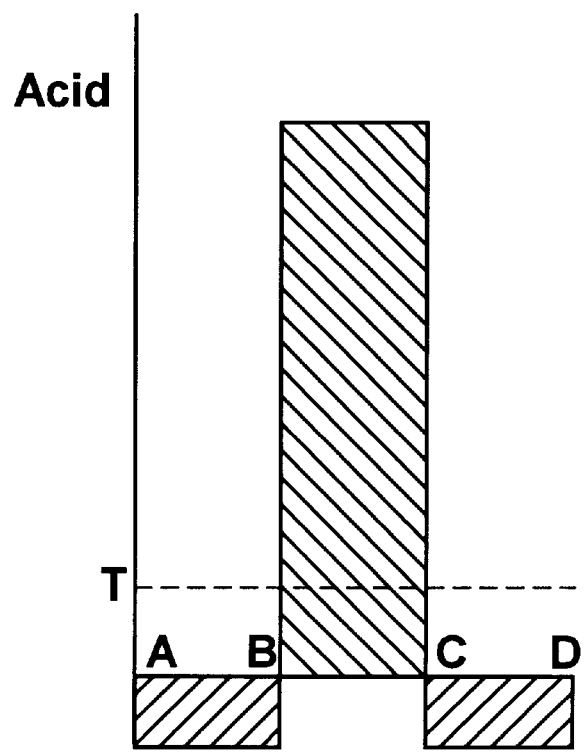

In the exposed areas, the unbuffered superacid and 4.5 moles of the secondary acid are immediately neutralized by the potassium acetate, which also deprotonates the protonated forms of both the original sensitizing dye and the phenylated form of this dye to produce the corresponding unprotonated dyes, thereby removing the absorption in the first wavelength range due to the sensitizing dye. The decomposition of the superacid precursor is catalyzed by the copper compound, leading to the formation of 3.5 moles of phenylated image dye. 5.5 Moles of the secondary acid reversibly protonate and form a salt with the image dye. Both the phenylated and the protonated image dyes are colored. 1 Mole of the image dye remains in its unprotonated, leuco form. FIG. 1D shows graphically the 5.5 moles of secondary acid (3.5 moles of aryl cation are also formed) remaining in the exposed areas.

In the non-exposed areas, the potassium acetate deprotonates the sensitizing dye, returning it to its unprotonated form, and thus reducing the $D_{min}$ of the image in this range (assuming, as is usual, that the absorption change in the image dye is an increase in absorption, i.e., increase in color, in the relevant wavelength range so that the non-exposed areas are the $D_{min}$ areas of the image). The decomposition of the superacid precursor and the deprotonation of the sensitizing dye consumes 5 moles of potassium acetate; 1 mole of potassium acetate remains in the non-exposed areas. This excess of base is represented in FIG. 1D as −1 moles of remaining acid. None of the image dye is protonated, all remaining in its unprotonated, leuco form. The provision of the excess potassium acetate serves to ensure that, if a small amount of uncatalyzed thermal decomposition of the secondary acid generator does occur in non-exposed areas AB and CD during the heating step, the small amount of secondary acid resulting will be neutralized by base before the secondary acid can effect changes in the image dye, as described in more detail below. The excess potassium acetate also ensures that, if minor decomposition of the secondary acid generator does occur after the imaging process has been completed, the minor amounts of acid generated will be neutralized by the potassium acetate and thus will not affect image dye in the non-exposed areas of the final image.

It will be seen from Table 1 that the "neutralization" of the superacid and secondary acid, and deprotonation of the protonated sensitizing dye by the potassium acetate, produce acetic acid. Although acetic acid is normally regarded as an acid, it is insufficiently acidic in the polymeric binders in which the present process is normally carried out to protonate the sensitizing dye or the image dye, and is thus not regarded as an acid for present purposes.

From the foregoing description, it will be seen that, in the exposed areas, the superacid catalyzes the breakdown of the secondary acid generator, so that the final quantity of secondary acid present is substantially larger than the quantity of unbuffered superacid produced directly by the imagewise radiation acting on the superacid precursor, although of course the secondary acid is typically a weaker acid than the superacid itself. This "chemical amplification" of the superacid by the secondary acid generator increases the number of moles of acid generated per einstein of radiation absorbed, and thus increases the contrast of the image produced by the present process as compared with simple generation of superacid by a superacid precursor. In practice, it has been found that, under proper conditions, at least 20, and in some cases 100 or more, moles of secondary acid can be liberated for each mole of unbuffered superacid present in the exposed areas following the imagewise irradiation.

The first preferred deprotonation process described above is convenient for use with many combinations of indicator sensitizing dye and secondary acid generator. However, this first preferred process requires that the superacid generated during the imagewise exposure effect acid-catalyzed thermal decomposition of the secondary acid generator in the presence of the protonated sensitizing dye, and such acid-catalyzed decomposition requires that the superacid protonate the secondary acid generator. If the sensitizing dye is capable of further protonation, and the singly protonated sensitizing dye is significantly more basic than the secondary acid generator, any superacid generated above the threshold T during the imagewise exposure will tend to doubly protonate the sensitizing dye rather than protonate the secondary acid generator. If the doubly protonated sensitizing dye absorbs the wavelength used for the imagewise exposure and also causes decomposition of the superacid precursor, such double protonation of the sensitizing dye is not a serious problem; the imagewise exposure can be continued until the concentration of acid in the exposed areas exceeds 2T, at which point all the sensitizing dye is doubly protonated, and unbuffered superacid is again available to protonate the secondary acid generator. After this continued exposure, the acid level diagram is similar to that shown in FIG. 1B, except that the acid concentration in the exposed area BC exceeds 2T rather than T. The subsequent heating and base addition steps can be carried out exactly as described above with reference to FIGS. 1C and 1D.

If, however, the sensitizing dye can be doubly protonated, the singly protonated sensitizing dye is significantly more basic than the secondary acid generator, and the doubly protonated form of the sensitizing dye either does not absorb the wavelength used for the imagewise exposure, or does absorb this wavelength but does not cause decomposition of the superacid precursor following such absorption, continuing the imagewise exposure will result in the acid concentration increasing to, at most, 2T, at which point all the sensitizing dye is doubly protonated, and further acid generation ceases. The present process can be carried out with this type of sensitizing dye, but requires an additional step, as will now be described with reference to Table 2 and FIGS. 2A–2E. In view of the number of possible species in the second preferred process illustrated in Table 2 and FIGS. 2A–2E and the uncertainties as to, for example, the exact species which is phenylated by the phenyl radicals liberated upon decomposition of the superacid precursor, or which counterion or mixture of counterions is associated with a given protonated sensitizing dye species, for simplicity the various possible protonated species derived from the sensitizing dye are grouped together without regard to their degree of phenylation. Thus, for example the term "doubly protonated S-DYE species" used in Table 2 refers to all doubly protonated species derived from the sensitizing dye, whether those species are substituted with 0, 1 or 2 phenyl groups derived from the superacid precursor.

TABLE 2

| EXPOSED AREA | | NON-EXPOSED AREA | |
|---|---|---|---|
| Component | Moles | Component | Moles |
| PRIOR TO USE | | | |
| [S-DYE] | 1 | [S-DYE] | 1 |
| Secondary acid generator | 10 | Secondary acid generator | 10 |
| $Ph_2I^+SbF_6^-$ | 5 | $Ph_2I^+SbF_6^-$ | 5 |
| AFTER INITIAL ULTRA-VIOLET EXPOSURE | | | |
| Singly protonated S-DYE species | 0.75 | Singly protonated S-DYE species | 0.75 |
| $SbF_6^-$ | 0.75 | $SbF_6^-$ | 0.75 |
| [S-DYE] | 0.25 | [S-DYE] | 0.25 |
| Secondary acid generator | 10 | Secondary acid generator | 10 |
| $Ph_2I^+SbF_6^-$ | 4.25 | $Ph_2I^+SbF_6^-$ | 4.25 |
| AFTER IMAGEWISE VISIBLE EXPOSURE | | | |
| Doubly protonated S-DYE species | 0.75 | Singly protonated S-DYE species | 0.75 |
| Singly protonated S-DYE species | 0.25 | $SbF_6^-$ | 0.75 |
| | | [S-DYE] | 0.25 |
| $SbF_6^-$ | 1.75 | Secondary acid generator | 10 |
| Secondary acid generator | 10 | $Ph_2I^+SbF_6^-$ | 4.25 |
| $Ph_2I^+SbF_6^-$ | 3.25 | | |
| AFTER SECOND ULTRA-VIOLET EXPOSURE | | | |
| Doubly protonated S-DYE species | 1 | Doubly protonated S-DYE species | 0.75 |
| $SbF_6^-$ | 2 | Singly protonated S-DYE species | 0.25 |
| Secondary acid generator | 10 | | |

TABLE 2-continued

| EXPOSED AREA | | NON-EXPOSED AREA | |
|---|---|---|---|
| Component | Moles | Component | Moles |
| $HSbF_6^-$ | 0.75 | $SbF_6^-$ | 1.75 |
| $Ph_2I^+SbF_6^-$ | 2.25 | Secondary acid generator | 10 |
| | | $Ph_2I^+SbF_6^-$ | 3.25 |
| AFTER HEATING | | | |
| Doubly protonated S-DYE species | 1 | Doubly protonated S-DYE species | 0.75 |
| $SbF_6^-$ | 2 | Singly protonated S-DYE species | 0.25 |
| $HSbF_6^-$ | 0.75 | | |
| Secondary acid | 10 | $SbF_6^-$ | 1.75 |
| $Ph_2I^+SbF_6^-$ | 2.25 | Secondary acid generator | 10 |
| | | $Ph_2I^+SbF_6^-$ | 3.25 |
| AFTER FIXING | | | |
| Unprotonated S-DYE species | 1 | Unprotonated S-DYE species | 1 |
| HOAc | 6 | HOAc | 0.75 |
| Image dye/secondary acid salt | 6.75 | Unprotonated image dye | 10 |
| | | KOAc | 1 |
| Unprotonated image dye | 1 | Secondary acid generator | 10 |
| Ph-image dye/secondary acid salt | 2.25 | Cu reagent | 1 |
| | | $KSBF_6$ | 5 |
| Cu reagent | 1 | PhOAc | 3.25 |
| $KSBF_6$ | 5 | | |
| K/secondary acid salt | 1 | | |

Figure 2A:
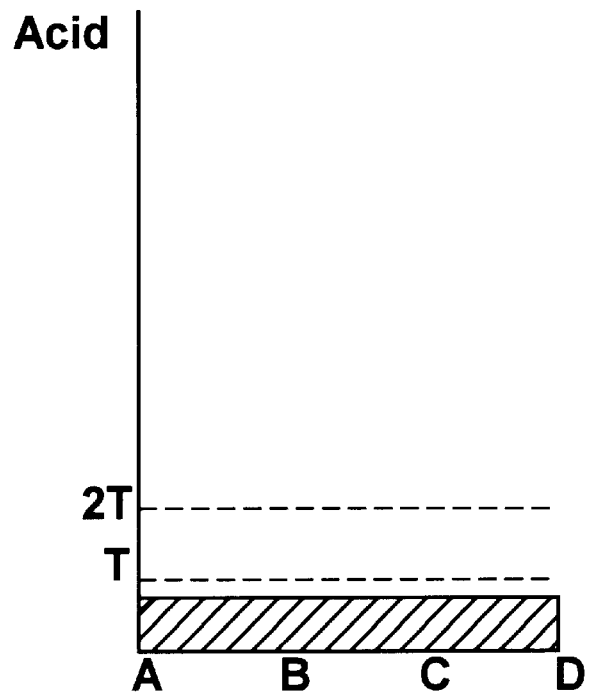
FIGS. 2A–2E show the acid concentrations in the exposed and non-exposed regions of the acid-generating layer during the various steps of a second preferred process of the present invention.
Figure 2B:
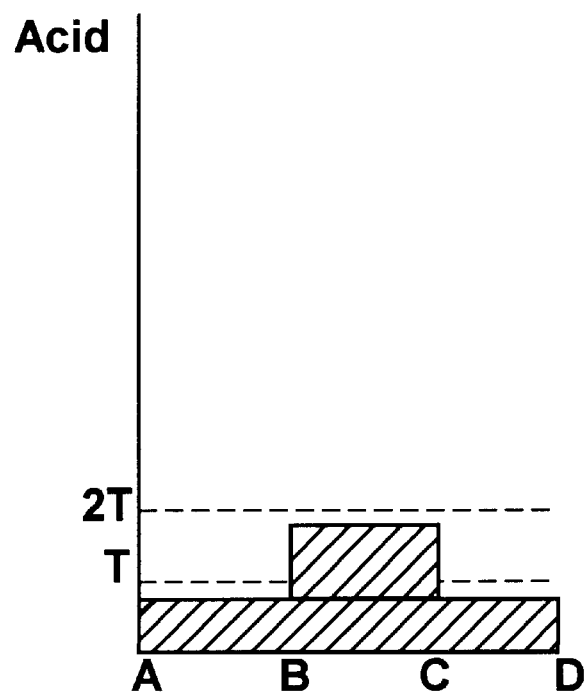

The second preferred deprotonation process of the invention shown in Table 2 begins in exactly the same manner as the first preferred deprotonation process described above with reference to Table 1; the same amounts of the same components are initially present in the imaging medium, and the same initial ultraviolet exposure is effected to generate 0.75 mole of buffered superacid throughout the imaging medium, thus converting 0.75 mole of sensitizing dye to its protonated form. Accordingly, FIG. 2A is essentially identical to FIG. 1A. However, in the next step, namely the imagewise exposure, the exposure is preferably continued until a further 1 mole of superacid precursor is decomposed by the sensitizing dye, so that 1.75 moles of acid are present in the acid-generating layer, as shown in FIG. 2B. If the sensitizing dye is of the type which is "consumed" by reaction with one molecule of superacid precursor, so that each mole of sensitizing dye can only generate one mole of superacid, the acid-generating reaction is self-limiting at this point. It is not essential that the imagewise exposure be continued to this point, since the only requirement for the later stages of the process is that, after the imagewise exposure, there be a substantial difference in acid concentration between the exposed and non-exposed areas. Accordingly, it may be convenient to continue the imagewise exposure to this point, thus rendering the imaging process less susceptible to temporal or areal variations in the radiation source used for the imagewise exposure. As shown in Table 2, at the conclusion of the imagewise exposure, the exposed areas of the acid-generating layer contain 0.75 mole of doubly protonated sensitizing dye species, 0.25 mole of singly protonated sensitizing dye species, 10 (unchanged) moles of secondary acid generator, and 3.25 moles of superacid precursor. (As in the first preferred process, obviously the imagewise exposure causes no change in the composition of the non-exposed areas of the medium.)

Figure 2C:
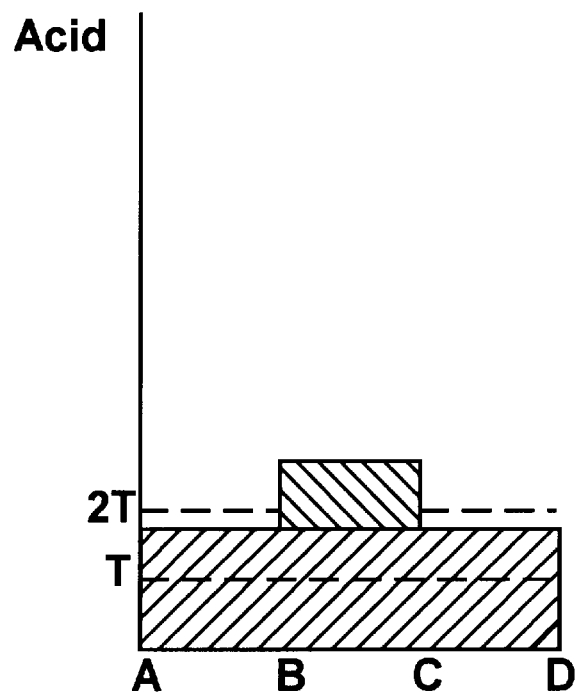

At this point in the process, all of the superacid is still buffered by the sensitizing dye and no unbuffered superacid is available to catalyze thermal decomposition of the secondary acid generator. Accordingly, the imagewise exposure is followed by a second blanket exposure with radiation in the second wavelength range, namely ultra-violet radiation in the process illustrated in Table 2 and FIGS. 2A–2E. As shown in FIG. 2C, this second ultra-violet exposure causes further decomposition of the superacid precursor and a uniform increase in acid concentration throughout the acid-generating layer. The amount of ultra-violet radiation applied in this blanket exposure is chosen so that, in the non-exposed areas, the acid concentration will not exceed the 2T threshold, so that all the acid will remain buffered by the sensitizing dye, but so that, in the exposed areas, the acid concentration will exceed the 2T threshold and unbuffered superacid will be present. FIG. 2C and Table 2 show the results obtained using a second ultra-violet exposure sufficient to decompose one mole of superacid precursor. Besides the unchanged secondary acid generator, the exposed areas of the acid-generating layer contain 1 mole of doubly protonated sensitizing dye species, 0.75 mole of unbuffered superacid and 2.25 moles of superacid precursor, while the non-exposed areas contain 0.75 mole of doubly protonated sensitizing dye species, 0.25 mole of singly protonated sensitizing dye species and 3.25 moles of superacid precursor.

Figure 2D:
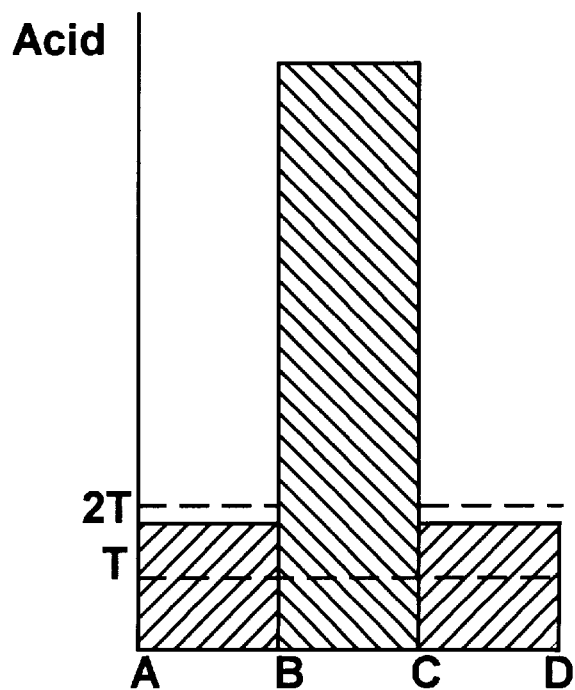
Figure 2E:
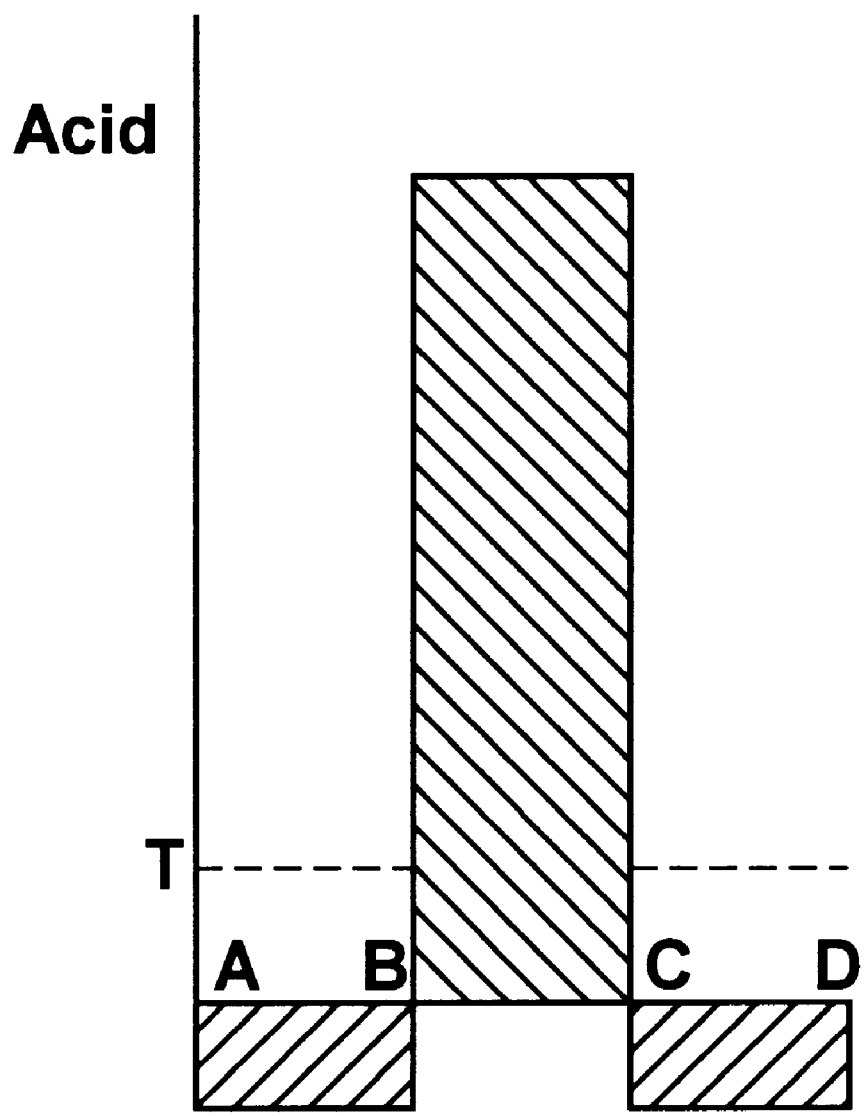

The remaining two steps of the second preferred process are essentially identical to the corresponding steps of the first preferred process. First, the imaging medium is heated so that in the exposed areas the unbuffered superacid will catalyze the thermal decomposition of the secondary acid generator, thus converting the 10 moles of secondary acid generator to (in theory) 10 moles of secondary acid. In the non-exposed areas, however, since no unbuffered superacid is present, essentially no generation of secondary acid occurs. FIG. 2D shows the result of the heating step graphically. Finally, the components of the acid-generating and color-change layers become intermixed. As in the first preferred process described above with reference to Table 1, Table 2 assumes that the color-change layer contains 10 moles of an indicator image dye, 1 mole of copper compound, 1 mole of a reducing agent (the products produced by oxidation of this reducing agent are again ignored in Table 2 for simplicity) and 6 moles of a base, shown as potassium acetate in Table 2. Table 2 also again assumes that the image dye is more basic than the sensitizing dye; the contrary case is discussed below. In the non-exposed areas, the copper, the reducing agent and the reactive material decompose all remaining superacid precursor, with generation of phenyl acetate (Table 2 assumes), phenyl iodide (omitted from Table 2 ) and potassium hexafluoroantimonate. In the exposed areas, the potassium acetate is protonated by the superacid and by some of the secondary acid. The copper reagent catalyzes decomposition of the remaining superacid precursor with the formation of phenyl cations, which react with the most nucleophilic species remaining, here assumed to be the image dye. (In practice, the decomposition of the superacid precursor is probably somewhat more complicated and other products may be produced; however, the exact type of decomposition products produced does not affect the essential nature of the present process.)

In the exposed areas, as in the first preferred process, the unbuffered superacid and 3.25 moles of the secondary acid are immediately neutralized by the potassium acetate, which also deprotonates all protonated forms of the sensitizing dye to produce the corresponding unprotonated forms. The decomposition of the superacid precursor is catalyzed by the copper compound, leading to the formation of 2.25 moles of phenylated image dye. 6.75 Moles of secondary acid reversibly protonate and form a salt with the image dye. Both the phenylated and the protonated image dyes are colored. 1 Mole of image dye remains unprotonated and in its leuco form.

In the non-exposed areas, the potassium acetate deprotonates all protonated forms of the sensitizing dye to produce the corresponding unprotonated forms, and 1 mole of potassium acetate remains (this free base is shown as −1 moles of acid if FIG. 2E), so that all the image dye stays in its unprotonated, leuco form and no color change occurs.

One advantage of the present deprotonation process is that, at least in many preferred embodiments of the invention, it is possible to compensate for any premature breakdown of the superacid precursor which may occur before use of the imaging medium. Such premature breakdown may occur, for example, by exposure of the imaging medium to radiation during transportation and storage or because the mixture of the superacid precursor and the sensitizing dye in the acid-generating layer undergoes slow decomposition on protracted storage. If, as in the two preferred processes described above, the first step of the process is blanket exposure of the imaging medium to radiation in the second wavelength range to generate superacid and convert the sensitizing dye to its protonated (first) form, the blanket exposure can be adjusted to ensure that the present process works properly, even if some decomposition of the superacid precursor has occurred earlier.

For example, to take an extreme case purely for purposes of illustration, suppose that the imaging medium shown in Table 1 is exposed to so much ultra-violet radiation during storage and transport that premature breakdown of 0.5 mole of superacid precursor occurs. At the beginning of imaging, all areas of the medium thus contain 0.5 mole of sensitizing dye, 10 moles of secondary acid generator, 4.5 moles of superacid precursor and 0.5 mole of protonated sensitizing dye. After spectral analysis to determine the amount of protonated sensitizing dye already present, the initial ultra-violet exposure may be adjusted so that, in exposed areas, only a further 0.25 mole of superacid precursor is decomposed. After this exposure, the medium will contain 0.75 mole of protonated sensitizing dye, and will thus be in exactly the same condition as the medium used in the first preferred process described above (at the stage represented in FIG. 1A), in which no premature breakdown of the superacid precursor occurred before imaging, but the initial ultra-violet exposure generated 0.75 mole of superacid. Also, provided that no substantial breakdown of superacid precursor occurs during transportation and storage, a deprotonation medium of the present invention which is produced with the sensitizing dye in its unprotonated form is, prior to imaging, essentially insensitive to radiation of the wavelength used for the imagewise exposure, since the unprotonated sensitizing dye, even when exposed to such radiation, does not cause substantial decomposition of the superacid precursor.

For similar reasons, all variants of the present process are relatively insensitive to variations in the radiation used for the imagewise exposure, such as variations in laser output, differences between individual lasers in an array used to form the imaging beam, timing errors in laser drivers, etc. For example, in the process shown in Table 1, the imagewise exposure causes decomposition of 0.75 mole of superacid precursor. If the imaging radiation delivered to the imaging medium varies by ±20%, some exposed areas will experience decomposition of 0.6 mole of superacid precursor, while others will experience decomposition of 0.9 mole. Thus, after the imagewise exposure, the concentration of unbuffered superacid in the exposed areas will vary from 0.35 to 0.65 mole. With appropriate control of the heating step, this range of variation in unbuffered superacid concentration will have minimal effects on the final image in cases where the medium is designed to be essentially binary, i.e., any specific pixel is either at $D_{min}$ or at $D_{max}$.

From Tables 1 and 2 and the related description above, it will be seen that, after the present medium has been imaged and fixed, in both the exposed non-exposed areas the sensitizing dye has been returned to its unprotonated form. This is always the case in the non-exposed areas, and is also the case in the exposed areas if the image dye is substantially more basic than the sensitizing dye. If this is not so, in the exposed areas the sensitizing dye will remain protonated (or possibly phenylated) and the absorption in the first wavelength range is a combination of that due to the protonated (or phenylated) image dye and that due to the protonated (or phenylated) sensitizing dye. In such cases, the sensitizing dye should be chosen so that the presence of its protonated (or phenylated) form in the $D_{max}$ areas does not cause objectionable effects on the image. This is especially important in color media having a plurality of different acid-generating layers and color-change layers since if, for example, the protonated (or phenylated) form of the sensitizing dye used in the acid-generating layer associated with the magenta color-change layer has a yellow color, crosstalk will result between the magenta and yellow components of the image. To reduce or eliminate such objectionable effects, it is desirable that the protonated (or phenylated) form of the sensitizing dye have a color similar to that of the colored form of the associated image dye. Sometimes it may be possible to use the same (or a chemically similar) dye as both the sensitizing dye and the image dye.

The potential problem discussed in the preceding paragraph is confined to the deprotonation process of the present invention. However, a related problem occurs in the nucleophile process of the invention if the nucleophile is more basic than the image dye.

The sensitizing dye used in the deprotonation process of the present invention may be any molecule, the absorption spectrum of which depends reversibly upon its state of protonation and which can cause decomposition of the superacid precursor used, provided of course that the dye is compatible with the other components of the imaging medium. The state of the sensitizing dye called herein the "unprotonated form" need not necessarily be a neutral molecule; the unprotonated form may be anionic but capable of being protonated to a neutral or cationic form. For example, fluorescein monomethyl ether can exist in a non-aqueous medium in anionic (deprotonated), neutral or cationic (protonated) forms; both the anionic and cationic forms are yellow, while the neutral form is colorless to the eye but absorbs strongly in the mid-ultra-violet region (around 320 nm). The spectral shift of the sensitizing dye upon protonation may be either hypsochromic (to shorter wavelength) or bathochromic (to longer wavelength). Fluorescein monomethyl ether exhibits both behaviors; the first protonation of the anionic form causes a hypsochromic shift, while the second protonation to the cationic form causes a bathochromic shift.

Preferred indicator sensitizing dyes for use in the present processes include fluoran dyes, phthalide dyes, xanthene dyes, acridine dyes, and dyes of the formulae:

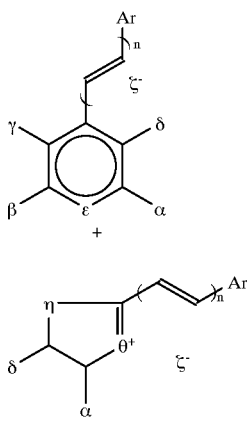

wherein:
- α and δ are each a hydrogen atom or an organic group in which a carbon atom is directly bonded to the ring carrying the groups α and δ, or α and δ together comprise the atoms necessary to complete a substituted or unsubstituted benzene ring;
- δ and γ are each a hydrogen atom or an organic group in which a carbon atom is directly bonded to the ring carrying the groups β and γ, or β and γ together comprise the atoms necessary to complete a substituted or unsubstituted benzene ring;
- ε is a oxygen, sulfur or selenium atom, or is an N—$R^a$ group, in which $R^a$ is a hydrogen atom, an alkyl group containing from about 1 to about 20 carbon atoms, or an aryl group;
- ζ is an anion;
- η is a $CR^cR^d$ group, a $CR^c$=$CR^d$ group, an oxygen or sulfur atom, or an N—$R^b$ group;
- θ is an oxygen, sulfur or selenium atom, or is an N—$R^a$ group;
- $R^a$ is a hydrogen atom, an alkyl group containing from about 1 to about 20 carbon atoms, and optionally bearing a protonated heteroatom substituent, or an aryl group;
- $R^b$ is an alkyl group containing from about 1 to about 20 carbon atoms, or an aryl group;
- $R^c$ and $R^d$ are each independently a hydrogen atom, an alkyl group containing from about 1 to about 20 carbon atoms or an aryl group;
- n is 0, 1, 2 or 3; and
- Ar is an aryl or heterocyclic group.

The groups α, β, γ and δ may be, for example:
- a. an alkyl group, for example an isopropyl, sec-butyl, tert-butyl, 2-ethyl-2-methylbutyl or 2,2-dimethylbutyl group;
- b. an alkenyl group, for example a vinyl group;
- c. an alkynyl group, for example an ethyne group;
- d. a cycloalkyl group, for example a cyclohexyl group;
- e. a cycloalkenyl group, for example a cyclohexenyl group;
- f. a polycyclic saturated hydrocarbon group, for example a decalinyl or adamantyl group;
- g. a polycyclic, ethylenically unsaturated hydrocarbon group, for example a 6,6-dimethylbicyclo[3.1.1]hept-2-en-2-yl or bicyclo[2.2.1]hept-2-en-5-yl group;
- h. an aryl group, for example a phenyl ring; or
- i. any of the foregoing substituents substituted with aryl, halo, cyano, amino or oxo groups, or containing ether, amine or urethane linkages.

Sensitizing dyes suitable for use in the deprotonation process are the fluoran, phthalide, xanthene and acridine dyes, and those of Formula I above in which ε is an N—$R^a$ grouping and $R^a$ is a hydrogen atom, and those of Formula II above in which θ is an N—$R^a$ grouping, in which $R^a$ is a hydrogen atom or an alkyl group bearing a protonated heteroatom, for example a hydroxyl group. The remaining dyes of Formulae I and II are suitable for use in the nucleophile process of the present invention.

Specific pyridinium dyes of Formula I which have been found useful in the present invention are the hexafluoroantimonate salts of the protonated forms of:
2,4,6-tris(4-methoxyphenyl)pyridine;
2,6-bis(4-methoxyphenyl)-4-(2-thienyl)pyridine;
2,6-bis(4-methoxyphenyl)-4-(2-(4-bromophenyl)pyridine;
2,6-bis(4-methoxyphenyl)-4-(2-naphthyl)pyridine;
2,4-bis(4-methoxyphenyl)-6-(2-naphthyl)pyridine;
2,4,6-tris(2,4,6-trimethoxyphenyl)pyridine; and
2,6-bis(4-methoxyphenyl)-4-(2-(1,4-dimethoxy)naphthyl) pyridine;
2,4,6-tris(2,4-dimethoxyphenyl)pyridine;
2-(2,4-dimethoxyphenyl)-4-(4-diphenylamino)-6-phenylpyridine;
2-(2,4-dimethoxyphenyl)-4-(4-diphenylamino)-6-methylpyridine; and
4-(9-ethylcarbazol-3-yl)-2,6-bis(4-methoxyphenyl)pyridine.

A useful quinolinium dye is the protonated form of 2-[2-[2,4 bis[octyloxy]phenyl]ethen-1-yl]quinoline (the unprotonated form of this dye is available from Yamada Chemical Co., Kyoto, Japan), while a useful xanthene dye is the protonated form of 3',6'-bis[N-[2-chlorophenyl]-N-methylamino]spiro[2-butyl-1,1-dioxo[1,2-benzisothiazole-3 (3H), 9'-(9H)xanthene]] (which may be prepared as described in U.S. Pat. No. 4,345,017).

Other dyes useful in the deprotonation process of the present invention are 2-[2-[9-ethylcarbazol-3-yl]ethen-1-yl]-1-[2-hydroxyethyl]-3,3-dimethyl-3H-indolium hexafluoroantimonate; and 5-bromo-2-[2-[9-ethylcarbazol-3-yl]ethen-1-yl]-1-[2-hydroxyethyl]-3,3-dimethyl-3H-indolium hexafluoroantimonate.

Specific preferred sensitizing dyes which have been found useful in the nucleophile process of the present invention include:
1-methyl-2-[2-[2,4-bis[octyloxy]phenyl]ethen-1-yl] quinolinium hexafluoroantimonate;
1-methyl-2-[2-[4-diphenylaminophenyl]ethen-1-yl] quinolinium hexafluoroantimonate;
1,3,3-trimethyl-2-[2-[9-phenyicarbazol-3-yl]ethen-1-yl]-3H-indolium hexafluoroantimonate;
1,3,3-trimethyl-2-[2-[9-ethylcarbazol-3-yl]ethen-1-yl]-3H-indolium hexafluoroantimonate;
2,6-di-t-butyl-4-(2-(9-phenylcarbazol-3-yl)ethen-1-yl) pyrylium hexafluoroantimonate; and
6-(but-2-oxy)-2-(1,1-dimethyleth-1-yl)-4-(2-(9-phenylcarbazol-3-yl)ethen-1-yl)benz[b]pyrylium hexafluoroantimonate.

Also, the prior art describes various combinations of nucleophiles and dyes which can be used in the nucleophile process of the present invention; see, for example, U.S. Pat. Nos. 5,258,274 and 5,314,795 (although note that in the present process the imaging medium may contain the nucleophile itself rather than a nucleophile-generating species as in these patents, since the nucleophile can be kept in a layer or phase separate from the acid-generating layer until the final heating step when the nucleophile converts the sensitizing dye to its second form). The nucleophile used in the present process may be a neutral molecule, for example a primary or secondary amine, a stabilized carbanion, for example a carbanion derived from a malonate ester or a nitroalkane, or a charged nucleophile, for example a thiolate.

The anion of the dye should be chosen with care having regard to the superacid which will be generated during the imaging process. For example, it is inadvisable to use iodide, or another anion derived from a weak acid, as the anion of the dye, since the presence of such an anion in the acid-generating layer during imaging will cause the superacid generated to protonate the anion, thus leading to the formation of HI, or an acid which is similarly weak in a polymeric medium of low dielectric constant (such as those typically used in the imaging media of the present invention), which cannot effectively protonate the secondary acid generator, and thus does not initiate the acid amplification process. Conveniently, the anion is chosen to be the same as that of the superacid precursor; thus, for example, when the preferred superacid precursor diphenyliodonium hexafluoroantimonate is used, the anion is conveniently hexafluoroantimonate.

Methods for the preparation of the aforementioned pyridinium dyes are described in the literature. One convenient method for the preparation of such dyes bearing identical substituents at the 2- and 6-positions is described in Weiss, J. Am. Chem. Soc., 74, 200 (1952) and comprises heating a mixture of an acetophenone, an aldehyde (that containing the desired 4-substituent) and ammonium acetate in acetic acid. A dihydropyridine is produced as the penultimate intermediate, but is oxidized to the pyridine by the intermediate chalcone. A second method is similar to the first, but uses hydroxylamine or unsymmetrical dimethylhydrazine in place of ammonium acetate; the penultimate intermediate in these cases are the N-hydroxydihydropyridine or N,N-dimethylaminodihydropyridine, which undergo elimination and aromatization without the need for an oxidizing agent. A third method, described in Krohnke, Synthesis, 1976, 1, can produce asymmetric pyridinium dyes. In this third method, an aryl aldehyde containing the desired 4 substituent and an acetophenone containing the desired 2-substituent are reacted to form an intermediate chalcone, which is then reacted with the phenacylpyridinium salt derived from the acetophenone containing the desired 6-substituent. The resultant pyridinium-substituted dihydropyridine undergoes loss of pyridine with aromatization. All three methods are illustrated in Examples 1–3 below.

In the present process, it is desirable that the layer or phase containing the sensitizing dye also comprise a cosensitizer. This cosensitizer is an electron-donor which reduces the excited state of the sensitizing dye, following which the reduced dye reacts with the superacid precursor so as to return the dye to its original state and transfer an electron to the superacid precursor. Alternatively, the cosensitizer may transfer an electron to the oxidized form of the sensitizing dye after the excited sensitizing dye has reduced the superacid precursor. In either case, the reaction brings about decomposition of the superacid precursor with formation of superacid. The presence of a cosensitizer capable of acting in this manner greatly improves the quantum efficiency of the reaction between the photoexcited sensitizing dye and the superacid precursor (i.e., the quantum efficiency of superacid generation and thus the sensitivity of the imaging medium). The cosensitizer must have an oxidation potential capable of reducing the excited state of the dye, but not so low that it reacts thermally with the superacid precursor; in practice, the cosensitizer should have an oxidation potential of about 700 to about 1000 mV relative to a saturated calomel electrode. Also, the cosensitizer must not be more basic than the secondary acid generator, so that it does not interfere with the superacid-catalyzed thermal decomposition of the secondary acid generator.

Preferred cosensitizers include triarylamines (for example, triphenylamine) and hydroquinones. Preferred triarylamine cosensitizers are triphenylamines in which at least one of the phenyl rings bears a para hydroxyalkyl, alkoxyalkyl or α-alkenyl group, and those in which at least one of the phenyl rings bears a meta substituent selected from the group consisting of alkoxy, aryloxy, arylamino, alkyl and aryl groups. In the latter case, the ring bearing the meta substituent should either have no para substituent, or should have a para hydroxyalkyl, alkoxyalkyl or α-alkenyl substituent.

Since the present process relies upon the production of unbuffered superacid, it is highly desirable that the process be conducted under essentially anhydrous conditions; as chemists are well aware, the most powerful acidic species that can exist in the presence of more than one equivalent of water is the hydroxonium (hydronium) ion, $[H_3O]^+$. Accordingly, if the medium in which the present process is conducted contains water, at least part of the superacid produced by the present process will simply generate hydroxonium ion. However, in the absence of water, the superacid yields an acidic species much stronger than hydroxonium ion, and this acidic species can effect the acid-catalyzed decomposition of various secondary acid generators which hydroxonium ion cannot. Typically, the present process is carried out with the superacid precursor and the sensitizing dye dispersed in a polymeric binder, and such binders can readily be chosen to provide an essentially anhydrous environment for the process.

In its most general form, the present process requires only that, following the formation of the imagewise distribution of the secondary acid, the sensitizing dye be converted to its second form in at least the non-exposed areas of the medium. Although, at least in theory, the appropriate reagent for effecting this conversion could be supplied from an external source (for example, by spraying a solution of the reagent on to the exposed medium), for practical reasons it is normally desirable to have the reagent present in the imaging medium prior to exposure, so that the imaging medium provides a self-contained imaging system not requiring the use of liquid reagents. Usually, it is convenient to have the reagent capable of converting the first form of the sensitizing dye to its second form present in the color-change layer or phase of the imaging medium, so that the mixing of the components of the acid-generating and color-change layers or phases introduces the reagent into the non-exposed areas of the medium, thus converting the sensitizing dye to its second form. However, there are certain applications of the invention where it may be desirable to include the reagent in a layer of the imaging medium other than the color-change layer. In particular, for practical reasons, it may be convenient to prepare imaging media of the invention by first depositing an acid-generating layer from a relatively non-polar medium on to a support, and then to deposit a color-change layer from a relatively polar medium on to the acid-generating layer. If this process is used to prepare a "dupe" film for use in the graphic arts industry, it is necessary that the medium be exposed from the color-change layer side, since exposing through the relatively thick support may lead to a loss in resolution. However, exposing through the color-change layer may require that the image dye (which in a write-white medium such as dupe film must be colored in base and essentially colorless in acid) be present in its colorless form during the exposure, since otherwise it may absorb the radiation intended for exposure of the underlying acid-generating layer. To ensure that the image dye is coated in a form which does not prevent imaging by absorbing the imaging radiation, a medium of this type conveniently comprises:

(a) a color-change layer comprising an image dye which has substantial absorption (i.e., is "colored," where the "color" in question will typically be in the near ultraviolet) in base but has low absorption in acid, the image dye being present in its protonated (colorless) form;

(b) an acid-generating layer; and (c) a layer containing a conversion reagent (typically a base) interposed between the acid-generating layer and the color-change layer, the quantity of the conversion reagent being sufficient to cause coloration of all the image dye in non-exposed regions of the medium after heating, plus any additional amount necessary for fixation.

In principle, in the present process the mixing of the components of the acid-generating and color-change layers should be effected after the generation of the secondary acid from the secondary acid generator. However, in practice both the generation of the secondary acid in the acid-generating layer and the mixing of the components of the two layers may be effected in a single heating step, since the superacid-catalyzed decomposition of the secondary acid generator will typically be essentially complete before mixing of the two layers becomes significant.

Obviously, it is important that the components of the acid-generating layer and the color-change layer not mix prematurely. In practice, as already noted, the present imaging medium will typically be formed by coating both layers from a solution or dispersion on to a support. To prevent premature mixing, it may be desirable to coat one layer from a polar medium and the other from a less polar medium. Typically, the acid-generating layer is coated from a less polar medium and the color-change layer from a more polar medium.

Any of the known superacid precursors, for example diazonium, phosphonium, sulfonium and iodonium compounds, may be used in this invention, but iodonium compounds are preferred. Especially preferred superacid precursors are diphenyliodonium salts, specifically diphenyliodonium hexafluoroantimonate, (4-octyloxyphenyl) phenyliodonium hexafluorophosphate and hexafluoroantimonate, bis(n-dodecylphenyl)iodonium hexafluoroantimonate and (4-(2-hydroxytetradecan1-yloxy) phenyl)phenyl iodonium hexafluoroantimonate.

Any secondary acid generator capable of superacid-catalyzed breakdown to give a secondary acid may be used in the present process. One preferred group of secondary acid generators is 3,4-disubstituted-cyclobut-3-ene-1,2-diones (hereinafter for convenience called "squaric acid derivatives") capable of generating squaric acid or an acidic derivative thereof, since squaric acid and its acidic derivatives are strong acids well suited to effecting color changes in acid-sensitive materials. Especially preferred squaric acid derivatives are those in which there is bonded to the squaric acid ring, via an oxygen atom, an alkyl or alkylene group, a partially hydrogenated aryl or arylene group, or an aralkyl group. The acid-catalyzed decomposition of these squaric acid derivatives causes replacement of the original alkoxy, alkyleneoxy, aryloxy, aryleneoxy or aralkoxy group of the derivative with a hydroxyl group, thus producing squaric acid or an acidic squaric acid derivative having one hydroxyl group.

The exact mechanism by which squaric acid or an acidic derivative thereof is formed in the present process may vary depending upon the type of squaric acid derivative employed. In some cases, for example di-t-butyl squarate, one or both groups attached via oxygen atoms to the squaric acid ring may thermally decompose to yield an alkene or arene, thus converting an alkoxy or aryloxy group to a hydroxyl group and forming the squaric acid or acidic derivative thereof. In other cases, for example 3-amino-4-(p-vinylbenzyloxy)cyclobut-3-ene-1,2-dione, there is no obvious mechanism for formation of a corresponding alkene or arene, and it appears that the mechanism of acid formation is migration of the vinylbenzyl carbocation or similar group to a different position within the molecule (probably to the amino group), and protonation of the remaining oxygen atom to form a hydroxyl group at the position from which the group migrates. In other cases, neither of these pathways is possible. However, in all cases the net effect is the replacement of the alkoxy, alkyleneoxy, aryloxy, aryleneoxy or aralkoxy group present in the original derivative with a hydroxyl group to form squaric acid or an acidic derivative thereof.

Those skilled in the art of organic chemistry will appreciate that the susceptibility to thermal decomposition of the squaric acid derivatives preferred for use in the present process is related to the stability of the cation produced from the ester grouping during the decomposition process. Although the stability of specific cations may be influenced by a variety of factors, including steric factors, which may be peculiar to a particular ester, in general it may be said that the squaric acid esters preferred for use in the present process are:

(a) primary and secondary esters of squaric acid in which the α-carbon atom (i.e., the carbon atom bonded directly to the —O— atom of the squarate ring) bears a non-basic cation-stabilizing group. This cation-stabilizing group may be, for example, an $sp^2$ or sp hybridized carbon atom, or an oxygen atom;

(b) tertiary esters of squaric acid in which the α-carbon atom does not have an $sp^2$ or sp hybridized carbon atom directly bonded thereto; and (c) tertiary esters of squaric acid in which the α-carbon atom does have an $sp^2$ or sp hybridized carbon atom directly bonded thereto, provided that this $sp^2$ or sp hybridized carbon atom (or at least one of these $sp^2$ or sp hybridized carbon atoms, if more than one such atom is bonded directly to the α-carbon atom) is conjugated with an electron-withdrawing group.

It will be apparent to skilled organic chemists that, provided one of the aforementioned types of ester groupings is present in the squaric acid derivative to produce one hydroxyl group after thermal decomposition, the group present in place of the other hydroxyl group of squaric acid is of little consequence, provided that this other group does not interfere with the thermal decomposition. Indeed, the wide variation possible in this other group has the advantage that this group can be varied to control other properties of the derivative, for example its compatibility with other components of the imaging medium, or its solubility in solvents used to form coating solutions used in the preparation of the imaging medium.

Examples of squaric acid derivatives useful in the present processes include:

(a) those of the formula:

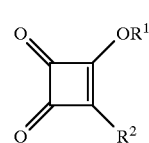

(III)

in which $R^1$ is an alkyl group, a partially hydrogenated aromatic group, or an aralkyl group, and $R^2$ is a hydrogen atom or an alkyl, cycloalkyl, aralkyl, aryl, amino, acylamino, alkylamino, dialkylamino, alkylthio, alkylseleno, dialkylphosphino, dialkylphosphoxy or trialkylsilyl group, subject to the proviso that either or both of the groups $R^1$ and $R^2$ may be attached to a polymer. Among the derivatives of Formula III, especially preferred groups are those in which (a) $R^1$ is an unsubstituted or phenyl substituted alkyl group containing a total of not more than about 20 carbon atoms, and $R^2$ is an alkyl group containing not more than about 20 carbon atoms, or a phenyl group (which may be substituted or unsubstituted); and (b) $R^1$ is a benzyl group and $R^2$ is an amino group.

(b) those of the formula:

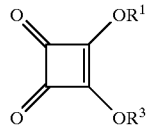

(IV)

in which $R^1$ and $R^3$ independently are each an alkyl group, a partially hydrogenated aryl group or an aralkyl group, subject to the proviso that either or both of the groups $R^1$ and $R^3$ may be attached to a polymer. Among the derivatives of Formula IV, an especially preferred group are those in which $R^1$ and $R^3$ are each independently an unsubstituted or phenyl substituted alkyl group containing a total of not more than about 20 carbon atoms. Specific preferred compounds of Formula IV are those in which $R^1$ and $R^3$ are each a tertiary butyl group, a benzyl group, an α-methylbenzyl group or a cyclohexyl group, namely di-tertiary butyl squarate, dibenzyl squarate, bis(α-methylbenzyl) squarate and dicyciohexyl squarate.

(c) those of the formula:

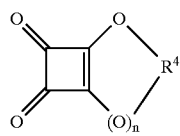

(V)

in which n is 0 or 1, and $R^4$ is an alkylene group or a partially hydrogenated arylene group. Among the derivatives of Formula V, an especially preferred group are those in which n is 1 and $R^4$ is an alkylene group containing not more than about 12 carbon atoms.

(d) those having at least one unit of the formula:

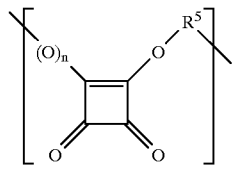

(VI)

in which n is 0 or 1, and $R^5$ is an alkylene or partially hydrogenated arylene group. Besides the fragmentable groups $R^5$, the compounds may also contain one or more units in which a non-fragmentable group is attached to a squarate ring, directly or via an oxygen atom.

The squaric acid derivatives of Formula VI include not only high polymers, but also dimers, trimers, tetramers, etc. including at least one of the specified units. The terminating groups on the derivatives of Formula VI may be any of groups $OR^1$ or $R^2$ discussed above with reference to Formula III. Thus, for example, Formula VI includes the squaric acid dimer derivative of the formula:

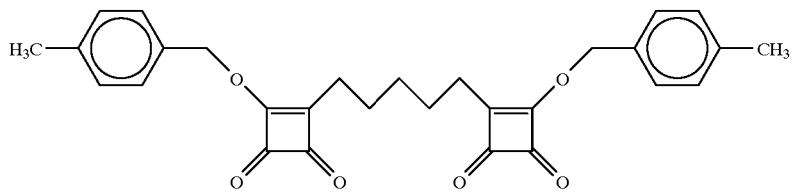

The squaric acid derivatives of Formulae III and IV are usually monomeric. However, these derivatives of Formulae III and IV can be incorporated into polymers by having at least one of the groups $R^1$, $R^2$ and $R^3$ attached to a polymer. Attachment of the squaric acid derivatives to a polymer in this manner may be advantageous in that it may avoid incompatibility and/or phase separation that might occur between a monomeric squaric acid derivative of Formula I or II and a polymeric binder needed in an imaging medium.

The attachment of the groups $R^1$, $R^2$ and $R^3$ to a polymer may be effected in various ways, which will be familiar to those skilled in the art of polymer synthesis. The squaric acid derivatives may be incorporated into the backbone of a polymer, for example in a polymer similar to the dimer of the formula given above. Alternatively, the squaric acid derivatives may be present as sidechains on a polymer; for example, one of the groups $R^1$, $R^2$ and $R^3$ could contain an amino group able to react with a polymer containing carboxyl groups or derivatives thereof to form an amide linkage which would link the squaric acid derivative as a sidechain on to the polymer, or these groups may contain unsaturated linkages that enable the squaric acid derivatives to be polymerized, either alone or in admixture with other unsaturated monomers.

In the present process, it is generally undesirable to form substantial quantities of gas during the acid-catalyzed decomposition of the secondary acid generator since such gas may distort the imaging medium or form vesicles therein, and such distortion or vesicle formation may interfere with proper image formation. Accordingly, if the decomposition of the squaric acid derivative yields an alkene, it is desirable that the groups $R^1$, $R^3$, $R^4$ and $R^5$ be chosen so that this alkene is a liquid at 20° C., and preferably higher, since some heating of the alkene will inevitably occur during the acid-catalyzed decomposition. Sometimes, however, the alkene liberated may be sufficiently soluble in the medium containing the squaric acid derivative that liberation of a highly volatile alkene will not result in distortion of, or vesicle formation in, the medium.

Another preferred group of secondary acid generators for use in the present process are oxalic acid derivatives that undergo acid-catalyzed breakdown to give oxalic acid or an acidic derivative thereof, for example an oxalic acid hemiester. Although oxalic acid and its acidic derivatives are not quite such strong acids as squaric acid and its acidic derivatives, oxalic acid and its derivatives are sufficiently strong acids for use with most image dyes. Also, oxalic acid derivatives are, in general, less costly than squaric acid derivatives.

The types of oxalic acid derivatives preferred for use in the present process are rather more diverse in structure than the squaric acid derivatives, and the choice of oxalic acid derivative for any specific process may be governed more by the thermal breakdown properties of the derivative than its exact chemical structure; in general, for practical reasons such as the limited temperature range to which other components of the imaging medium may safely be exposed, it is preferred that the oxalic acid derivative be one which begins to decompose thermally at a temperature in the range of about 140° to about 180° C., as measured by differential scanning calorimetry in a nitrogen atmosphere at a 10° C./minute temperature ramp, in the absence of any catalyst. Since the presence of an acid catalyst lowers the thermal decomposition temperature of oxalic acid derivatives by at least about 20° C. and potentially significantly more, derivatives which decompose uncatalyzed at about 140° to about 180° C., will, in the presence of acid, decompose at temperatures as low as about 65° C., temperatures to which other components of the imaging medium can in general be exposed.

The factors affecting the ability of the oxalic acid derivatives to undergo acid-catalyzed thermal decomposition are similar to those affecting the ability of the aforementioned squaric acid derivatives to undergo the same reaction, and thus the preferred ester groups are of the same types. Accordingly, preferred oxalic acid derivatives for use in the present process include:

(a) primary and secondary esters of oxalic acid in which the α-carbon atom (i.e., the carbon atom bonded directly to the —O— atom of the oxalate grouping) bears a non-basic cation-stabilizing group. This cation-stabilizing group may be, for example, an $sp^2$ or sp hybridized carbon atom, or an oxygen atom;

(b) tertiary esters of oxalic acid in which the α-carbon atom does not have an sp or $sp^2$ hybridized carbon atom directly bonded thereto; and (c) tertiary esters of oxalic acid in which the α-carbon atom does have an $sp^2$ or sp hybridized carbon atom directly bonded thereto, provided that this $sp^2$ or sp hybridized carbon atom (or at least one of these $sp^2$ or sp hybridized carbon atoms, if more than one such atom is bonded directly to the α-carbon atom) is conjugated with an electron-withdrawing group.

(d) an ester formed by condensation of two moles of an alcohol with the bis(hemioxalate) of a diol, provided that the ester contains at least one ester grouping of types (a), (b) or (c) above. One example of an ester of this type is that of the structure:

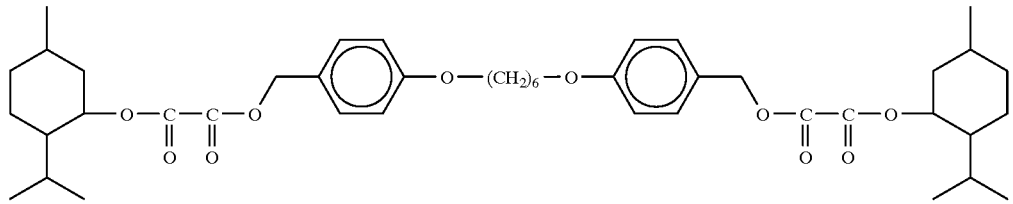

which can be regarded as formed from two moles of menthol (2-methylethyl4-methylcyclohexanol) and one mole of the bis(hemioxalate) of 1,6-bis(4-hydroxymethylphenoxy) hexane. Since the structure of the central residue of the diol in such esters can vary widely, the solubility and other properties of the esters can be "tuned" as required for compatibility with other components of the imaging medium, while the nature of the end groups, which undergo the acid-forming thermal decomposition, can be varied independently of the nature of the central residue.

(e) polymeric oxalates derived from polymerization of oxalate esters having an ethylenically unsaturated group, provided that the ester contains at least one ester grouping of type (a), (b) or (c) above. As with the squaric acid derivatives discussed above, use of a polymeric oxalate rather than a monomeric one may be advantageous in that it may avoid incompatibility and/or phase separation that might occur between a monomeric derivative and a polymeric binder needed in an imaging medium. Use of a polymeric derivative also tends to inhibit diffusion of the oxalate through the imaging medium during storage before imaging. Although polymeric oxalates can be formed in other ways, at present we prefer to form such oxalates by first forming an oxalate ester in which one of the ester groupings comprises an ethylenically unsaturated group, and then polymerizing this ester using a conventional free radical polymerization initiator, for example azobis(isobutyronitrile) (AIBN). The ethylenically unsaturated group is conveniently an acrylate or methacrylate group, while the other ester grouping in the monomeric oxalate can be any of the types discussed above.

(f) Condensation polymers of oxalates, provided that the ester contains at least one ester grouping of type (a), (b) or (c) above. This type of polymer also possesses the advantages discussed under (e) above.

Methods for the synthesis of the preferred secondary acid generators described above are given in the aforementioned U.S. Pat. No. 5,286,612, application Ser. No. 08/141,852, and International Application No. PCT/US93/10215.

Other secondary acid generators useful in the present process are described and claimed in the aforementioned copending application Ser. No. 08/757,195.

The image dye used in the present invention may be any material that undergoes a color change in the presence of the secondary acid. Thus any conventional indicator dye may be used as the acid-sensitive material, as may the leuco dyes disclosed in U.S. Pat. Nos. 4,602,263; 4,720,449 and 4,826,976, which are also sensitive to acid.

As will be apparent to those skilled in the imaging art, a medium of the present invention which contains a plurality of color-change layers (for example, a full color medium containing three or four color-change layers) need not use the present process in all of the color-change layers; one or more of the color-change layers can use the present process, while the other color-change layer(s) use other color-forming mechanisms, for example the '612 process or conventional sensitization of superacid precursors with non-basic polycyclic aromatic sensitizers. For example, the specific preferred embodiment of the invention described below with reference to FIG. 3 uses two acid-generating and two color-change layers using the present process, and one acid-generating and color-change layer using a conventional non-basic polycyclic aromatic sensitizer.

It should be noted that the present process may allow the use of combinations of superacid precursor and indicator sensitizing dye in which the combination of the precursor and the absorbing (i.e., first) form of the sensitizing dye is unstable on long term storage. Provided that the combination of the precursor and the non-absorbing (i.e., second) form of the sensitizing dye is stable on long term storage, the relevant acid-generating layer can be prepared with the dye in its second (or other precursor) form, and the first form of the dye produced immediately before the imagewise exposure; in a deprotonation process, the conversion of the second form of the sensitizing dye to its first form is conveniently accomplished by exposing the imaging medium to actinic radiation effective to generate superacid within the acid-generating layer, as described above with reference to Table 1. After the imagewise exposure, the conversion of the sensitizing dye to its second form in accordance with the present invention and/or fixing effected by destruction of the remaining superacid precursor will ensure that the unstable combination of the superacid precursor and the first form of the sensitizing dye is not present after imaging.

Preferred uses of the present process include:

(a) the use of visible imagewise exposure to produce a visible image, which may be positive or negative;

(b) a true- or false-sensitized full color image exposed at three different wavelengths (for example, a print paper)

(c) the use of near infra-red (700–1200 nm) radiation to produce a visible image having good $D_{min}$ when viewed in reflection (in this process, the first form of the sensitizing dye has a near infra-red absorption peak and the second form of the dye has a substantially lower visible absorption than the first form);

(d) the use of ultra-violet exposure to form an ultra-violet photomask; and (e) the formation of a full color image using a single source (preferably a laser) at a single visible or near infra-red wavelength to effect imagewise exposure of all three acid-generating layers of the medium.

Process (e) above conveniently uses a deprotonation process of the invention with an imaging medium having three associated pairs of acid-generating layers and color-change layers (each pair comprising an acid-generating layer and a color-change layer may hereinafter be called a "bilayer"), with each adjacent pair of bilayers being separated by an acid-impermeable interlayer. This type of imaging medium comprises:

a first acid-generating layer comprising a sensitizing dye in its protonated form, optionally a cosensitizer, a superacid precursor and a secondary acid generator;

a first color-change layer disposed adjacent the first acid-generating layer and comprising a reactive material, a copper compound and a first image dye undergoing a change in its absorption of radiation upon contact with the secondary acid generated upon acid-catalyzed decomposition of the secondary acid generator in the first acid-generating layer;

a first acid-resistant interlayer superposed on the first acid-generating layer and the first color-change layer;

a second acid-generating layer disposed on the opposed side of the first acid-resistant interlayer from the first acid-generating layer and the first color-change layer, the second acid-generating layer comprising a sensitizing dye in its unprotonated form, optionally a cosensitizer, a superacid precursor and a secondary acid generator, the second acid-generating layer further comprising a first auxiliary sensitizer which renders the superacid precursor therein susceptible to decomposition by actinic radiation of a first wavelength in the second wavelength range, but not susceptible to decomposition by actinic radiation of a second wavelength in the second wavelength range;

a second color-change layer disposed adjacent the second acid-generating layer and on the opposed side of the first acid-resistant interlayer from the first acid-generating layer and the first color-change layer, the second color-change layer comprising a reactive material, a copper compound and a second image dye undergoing a change in its absorption of radiation upon contact with the secondary acid generated upon acid-catalyzed decomposition of the secondary acid generator in the second acid-generating layer, the absorption change undergone by the second image dye being different from that undergone by the first image dye;

a second acid-resistant interlayer disposed on the opposed side of the second acid-generating layer and second color-change layer from the first acid-resistant interlayer;

a third acid-generating layer disposed on the opposed side of the second acid-resistant interlayer from the second acid-generating layer and second color-change layer, the third acid-generating layer comprising a sensitizing dye in its unprotonated form, optionally a cosensitizer, a superacid precursor and a secondary acid generator, the third acid-generating layer further comprising a second auxiliary sensitizer which renders the superacid precursor therein suceptible to decomposition by actinic radiation of the second wavelength in the second wavelength range, but not susceptible to decomposition by actinic radiation of the first wavelength in the second wavelength range; and a third color-change layer disposed adjacent the third acid-generating layer and on the opposed side of the second acid-resistant interlayer from the second acid-generating layer and the second color-change layer, the third color-change layer comprising a reactive material, a copper compound and a third image dye undergoing a change in its absorption of radiation upon contact with the secondary acid generated upon acid-catalyzed decomposition of the secondary acid generator in the third acid-generating layer, the absorption change undergone by the third image dye being different from those undergone by the first and second image dyes. Very conveniently, in this preferred form of imaging medium, the same sensitizing dye, superacid precursor and secondary acid generator are present in each of the three acid-generating layers. If the image is to be fixed, the same fixing reagent is also preferably used in each of the three color-forming layers.

This type of imaging medium is imaged in the following manner. First, the medium is imagewise exposed, from the surface closer to the third acid-generating layer, to actinic radiation in the first wavelength range, thereby causing, in the exposed areas of the first acid-generating layer or phase, the sensitizing dye to decompose at least part of the superacid precursor, with formation of superacid in the first acid-generating layer, without substantial production of superacid in the second and third acid-generating layers. Thereafter, the whole imaging medium is exposed to radiation of the first wavelength in the second wavelength range, thus decomposing part of the superacid precursor in the second acid-generating layer to produce superacid and converting at least part of the sensitizing dye in the second acid-generating layer to its protonated form, without substantial production of superacid in the third acid-generating layer. The medium is then imagewise exposed to actinic radiation in the first wavelength range, thus causing, in the exposed areas of the second acid-generating layer or phase, the sensitizing dye to decompose at least part of the superacid precursor, with formation of superacid in the second acid-generating layer, without substantial production of superacid in the first and third acid-generating layers. Thereafter, the whole imaging medium is exposed to radiation of the second wavelength in the second wavelength range, thus decomposing part of the superacid precursor in the third acid-generating layer to produce superacid and converting at least part of the sensitizing dye in the third acid-generating layer to its protonated form. The medium is then imagewise exposed to actinic radiation in the first wavelength range, thus causing, in the exposed areas of the third acid-generating layer or phase, the sensitizing dye to decompose at least part of the superacid precursor, with formation of superacid in the third acid-generating layer, without substantial production of superacid in the first and second acid-generating layers. The last two stages of the imaging process are heating the medium to cause, in the exposed areas of the first, second and third acid-generating layers, acid-catalyzed thermal decomposition of the secondary acid generator and formation of the secondary acid, and admixing the components of the first acid-generating layer with those of the first color-change layer, the components of the second acid-generating layer with those of the second color-change layer, and the components of the third acid-generating layer with those of the third color-change layer, thus causing, in the areas of the medium exposed to the three imagewise exposures, the secondary acids to bring about the changes in absorption of the first, second and third image dyes and thus form a trichrome image, and the copper compound and reactive material to destroy the remaining superacid precursor in each of the three acid-generating layers, thus fixing the image. If the same sensitizing dye is used in each of the three acid-generating layers, all three imagewise exposures can be effected using radiation of the same wavelength (for example, a single laser) thus avoiding, for example, the need for three separate sources of imaging radiation all of which must be scanned across the imaging medium.

Besides the acid-generating and color-change layers or phases, the imaging media of the present invention may comprise a support and additional layers, for example, a subbing layer to improve adhesion to the support, acid-impermeable interlayers (as discussed above) for separating multiple bilayers from one another, an anti-abrasive topcoat layer, and other auxiliary layers.

The support employed may be transparent or opaque and may be any material that retains its dimensional stability at the temperature used for image formation. Suitable supports include paper, paper coated with a resin or pigment, such as, calcium carbonate or calcined clay, synthetic papers or plastic films, such as polyethylene, polypropylene, polycarbonate, cellulose acetate and polystyrene. The preferred material for the support is a polyester, desirably poly(ethylene terephthalate).

Usually the acid-generating and color-change layers or phases will each also contain a binder; typically these layers are formed by combining the active materials and the binder in a common solvent, applying a layer of the coating composition to the support and then drying. Rather than a solution coating, the layer may be applied as a dispersion or an emulsion. The coating composition also may contain dispersing agents, plasticizers, defoaming agents, coating aids and materials such as waxes to prevent sticking.

The binder used for the acid-generating layer(s) must of course be non-basic, such that the superacid is not buffered by the binder. Examples of binders that may be used include styrene-acrylonitrile copolymers, polystyrene, poly($\alpha$-methylstyrene), copolymers of styrene and butadiene, poly(methyl methacrylate), copolymers of methyl and ethyl acrylate, poly(vinyl butyral), polycarbonate, poly(vinylidene chloride) and poly(vinyl chloride). It will be appreciated that the binder selected should not have any adverse effect on the superacid precursor, sensitizing dye, secondary acid generator, fixing reagent (if any) or image dye incorporated therein. Also, the binder should be heat-stable at the temperatures encountered during the heating step and should be transparent so that it does not interfere with viewing of the image. The binder must of course transmit the actinic radiation used in the exposure steps.

The imaging media of the present invention may be used in any of the ways in which the aforementioned '489 and '612 media have been used. Specifically, the imaging media of the present invention are very suitable for use in slide blanks similar to those described in copending applications Ser. Nos. 08/226,452 and 08/226,657, both filed Apr. 12, 1994 and assigned to the same assignee as the present application (now U.S. Pat. Nos. 5,422,230 and 5,451,478 respectively) and the corresponding International Applications Nos. PCT/US95/04401 and PCT/US95/04395 respectively (Publication Nos. WO 95/27623 and WO 95/27622 respectively).

Thus, one preferred slide blank of the present invention comprises:

a support;

a mask layer having a substantially transparent central portion and a non-transparent peripheral portion surrounding the central portion; and, an imageable layer comprising an imaging medium of the present invention which is imageable to form an image which can be viewed in transmission, the support, mask layer and imageable layer being secured together so that the support and the imageable layer extend across essentially the entire transparent central portion of the mask layer, at least the portion of the support adjacent the central portion of the mask layer being substantially transparent.

A second preferred slide blank of the present invention comprises:

a support at least part of which is essentially transparent;

an imageable layer superposed on one face of the support, the imageable layer comprising an imaging medium of the present invention which is imageable to form an image which can be viewed in transmission; and a protective layer superposed on the imageable layer on the opposed side thereof from the support, at least part of the protective layer being essentially transparent;

the support, imageable layer and protective layer being secured together to form a slide blank having a thickness of at least about 0.8 mm, and the thickness of the protective layer being such that no part of the imageable layer containing the color-forming composition is (b) an indicator sensitizing dye of the formula:

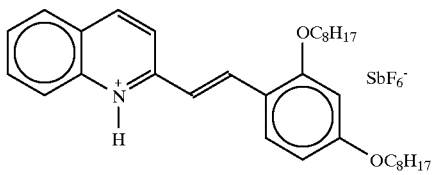

(the unprotonated form is available from Yamada Chemicals, Kyoto, Japan); this sensitizing dye sensitizes the superacid precursor to visible radiation at approximately 450 nm);

(c) a secondary acid generator, which undergoes a superacidcatalyzed thermal decomposition to form a secondary acid, this secondary acid generator being of the formula:

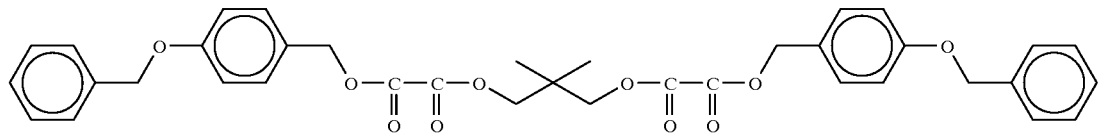

more than about 0.2 mm from one external surface of the slide blank.

For further details of these preferred slide blanks, methods for their use and slides produced therefrom, the reader is referred to the aforementioned applications Ser. Nos. 08/226,452 and 08/226,657, and International Applications Nos. PCT/US95/04401 and PCT/US95/04395.

Preferred embodiments of the invention will now be described, though by way of illustration only, with reference to FIG. 3 of the accompanying drawings, which shows a schematic cross-section through a full color imaging medium (generally designated 10) of the invention as the image therein is being fixed by being passed between a pair of hot rollers 12.

In a first preferred embodiment of the invention, the imaging medium 10 comprises a support 14 formed from a plastic film. Typically the support 14 will comprise a polyethylene terephthalate film 3 to 10 mils (76 to 254 m$\mu$) in thickness, and its upper surface (in FIG. 3) may be treated with a sub-coat, such as are well-known to those skilled in the preparation of imaging media, to improve adhesion of the other layers to the support.

On the support 14 is disposed a first acid-generating layer 16 comprising:

(a) a superacid precursor, namely (4-octyloxyphenyl) phenyliodonium hexafluoroantimonate;

(d) a cosensitizer, preferably triphenylamine; and (e) a polystyrene binder.

On the opposed side of the acid-generating layer 16 from the support 14 is disposed a first color-change layer 18 comprising:

(a) a first image dye, of the formula:

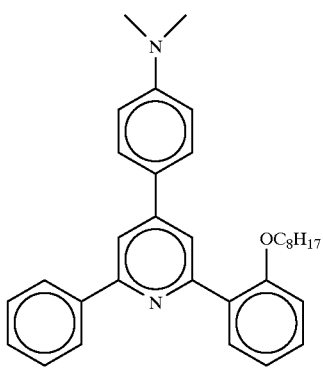

(available from Hilton Davis Co., 2235 Langdon Farm Road, Cincinnati, Ohio 45237 under the tradename "Copikem 37"), which changes from colorless to yellow in the presence of an acid;

(b) copper(II) acetate;

(c) a reactive material, namely potassium acetate; and (d) a binder comprising Acryloid B82 (available from Rohm & Haas, Philadelphia, Pa. 19104) and poly(vinyl alcohol); the poly(vinyl alcohol) acts as both a binder and a reducing agent for the fixing process.

The acid-generating layer 16 and the color-change layer 18 both contain a binder having a glass transition temperature substantially above room temperature.

Superposed on the first color-change layer 18 is an acid-impermeable layer 20, which serves to prevent acid generated in the second acid-generating layer 22 (see below) during imaging penetrating to the first color-change layer 18. Superposed on the acid-impermeable layer 20 is a second acid-generating layer 22, which contains the same superacid precursor, secondary acid generator and binder as the first acid-generating layer 16. However, the second acid-generating layer 22 contains, in its protonated form, as an indicator sensitizing dye, 2,4,6-tris(2,4-dimethoxyphenyl) pyridine, which sensitizes the superacid precursor to visible/near ultra-violet radiation of approximately 400 nm wavelength.

Superposed on the second acid-generating layer 22 is a second color-change layer 24 which is identical to the first color-change layer, except that the Copikem 37 is replaced by a second image dye, of the formula:

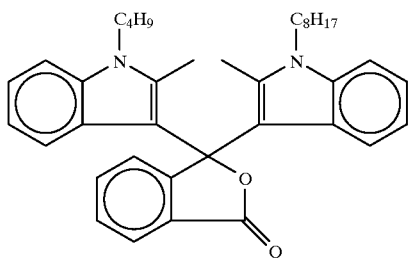

(available from Hilton Davis Co. under the tradename "Copikem 35"), which changes from colorless to magenta in the presence of an acid.

The next layer of the imaging medium is a second acid-impermeable interlayer 26, identical to the layer 20. Superposed on the acid-impermeable layer 26 is a third acid-generating layer 28, which contains the same superacid precursor, secondary acid generator and binder as the first and second acid-generating layers 16 and 22 respectively. However, this third acid-generating layer 28 does not contain an indicator sensitizing dye, but instead contains a conventional non-basic polycyclic aromatic sensitizer, namely 1-vinylpyrene, which sensitizes the superacid precursor to ultra-violet radiation of approximately 350 nm wavelength. Superposed on the third acid-generating layer 28 is a third color-change layer 30 which is identical to the first color-change layer, except that the Copikem 37 is replaced by a third image dye, of the formula:

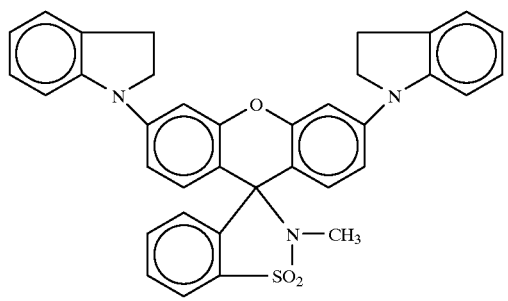

(see U.S. Pat. No. 4,345,017) which changes from colorless to cyan in the presence of an acid. Finally, the imaging medium 10 comprises an abrasion-resistant topcoat 32.

The imaging medium 10 is exposed by writing on selected areas of the medium with three radiation sources having wavelengths of 450, 400 and 350 nm respectively. The three radiation sources may be applied simultaneously or sequentially; for example, the medium may be scanned in a raster pattern simultaneously by the focused beams from three lasers of appropriate wavelengths, or the medium may be exposed sequentially through three masks to radiation from lamps generating radiation of appropriate wavelengths. The 450 nm radiation, which carries the yellow channel of the desired image, images the first acid-generating layer 16, the 400 nm radiation, which carries the magenta channel, images the second acid-generating layer 22 and the 350 nm radiation, which carries the cyan channel, images the third acid-generating layer 28. Thus, as described above with reference to FIGS. 1A–1D, since the sensitizing dyes in the first and second acid-generating layers 16 and 22 respectively are present in protonated form (i.e., these two layers are, prior to imaging, as shown in FIG. 1A, except that all the sensitizing dye, not merely 75%, is present in protonated form), latent images in superacid are formed in the first and second acid-generating layers 16 and 22. A latent image in superacid is also present in the third acid-generating layer 28, since the vinylpyrene sensitizer used in this layer does not buffer the superacid produced by decomposition of the superacid precursor.

The imaging medium 10 is passed between the heated rollers 12; the heat applied by these rollers causes the superacid present in the exposed areas of the acid-generating layers 16, 22 and 28 to cause catalytic breakdown of the secondary acid generator therein, thus causing formation of a quantity of secondary acid substantially greater than the quantity of superacid generated by the imagewise exposures. The heat and pressure applied by the heated rollers 12 also raise the acid-generating layers 16, 22 and 28 and the color-change layers 18, 24 and 30 above their glass transition temperatures, thus causing the components present in each acid-generating layer to intermix with the components present in its associated color-change layer. Accordingly, the three associatedlayers are "developed" and fi color-change layers are "developed" and fixed as described above with reference to Table 1; i.e., the copper compound decomposes the remaining superacid precursor and the base neutralizes the superacid present. In these exposed areas, the secondary acid produced in the acid-generating layer effects the color change of the image dye in the associated color-change layer, thereby forming yellow, magenta and cyan images in the layers 18, 24 and 30. In the non-exposed areas, excess base remains and the image dye remains uncolored. The acid-impermeable interlayers 20 and 26 prevent the superacid or the secondary acid generated in the second and third acid-generating layers 22 and 28 respectively migrating to the first and second color-change layers 18 and 24 respectively, thus preventing crosstalk among the three images. The mixing of the components present in each bilayer also causes the base present in each of the color-change layers to deprotonate the protonated forms of the sensitizing dye (in the layers using indicator sensitizing dye) present in the nonexposed areas of its associated acid-generating layer, thus removing the visible absorption due to the protonated sensitizing dye, and reducing the $D_{min}$ of the images to a low level.

Figure 3:
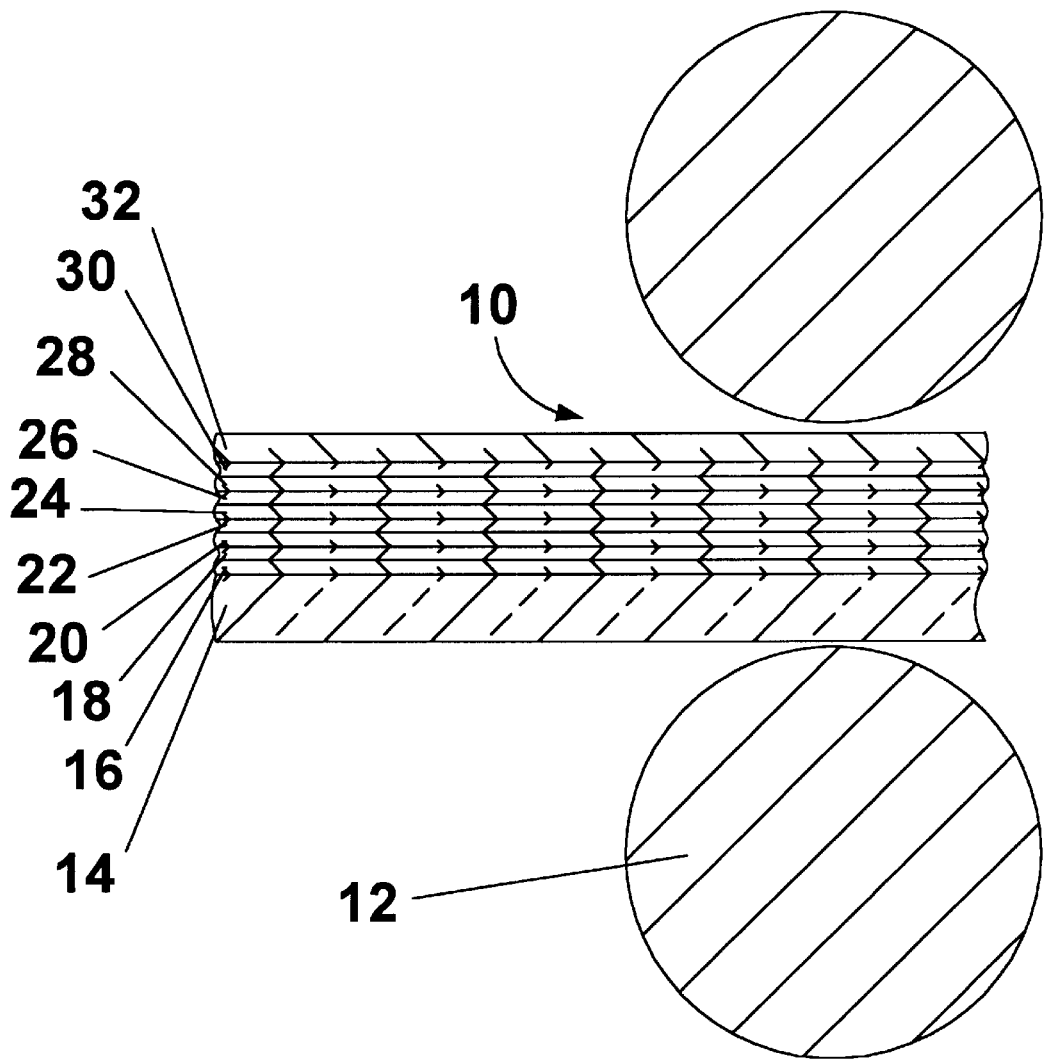
FIG. 3 is a schematic cross section through an imaging medium of the present invention as it is being passed between a pair of hot rollers during the imaging process of the present invention.

In a second preferred embodiment of the invention, the order of the layers is also as shown in FIG. 3, but the chemical compositions of certain layers differ from those in the first preferred embodiment described above as follows.

The first acid-generating layer 16 comprises:

(a) a superacid precursor, namely [4-[2-hydroxytetradecan-1-yloxy]phenyl]phenyliodonium hexafluoroantimonate;

(b) a nucleophilically-bleachable sensitizing dye of the formula:

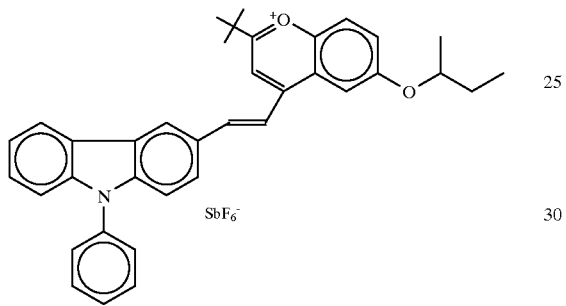

This sensitizing dye sensitizes the superacid precursor to red visible radiation;

(c) a secondary acid generator, which undergoes thermal decomposition to form a secondary acid, this thermal decomposition being catalyzed by the hexafluoroantimonate superacid generated from the superacid precursor and the secondary acid (namely a diphenylphosphoric acid) generated from the secondary acid generator; this secondary acid generator is of the formula:

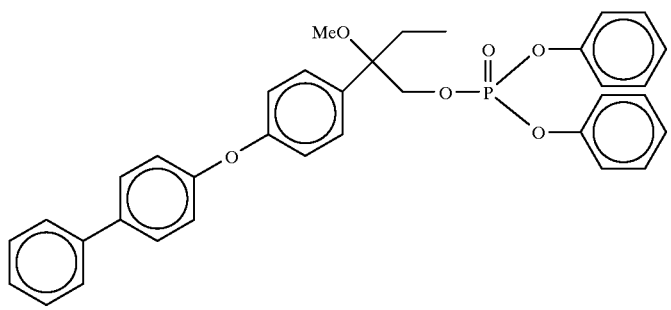

(d) a cosensitizer, namely tris(m-methylphenyl)amine;

(e) a hydroquinone fixing reagent; and (f) a polystyrene binder.

The first color-change layer 18 comprises:

(a) a first image dye, of the formula:

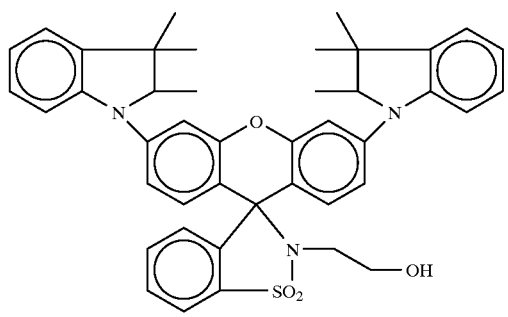

which changes from colorless to cyan in the presence of an acid;

(b) a phenolic nucleophile, namely 1,3-dihydroxy-4-dodecylbenzene (c) an amine, namely N,N'-bis(3-aminopropyl)piperazine; and (d) a binder, namely poly(2-hydroxypropyl methacrylate).

The second acid-generating layer 22, in this second embodiment contains the same superacid precursor, secondary acid generator, cosensitizer, fixing reagent and binder as the first acid-generating layer 16 of the same embodiment.

However, the second acid-generating layer 22 contains, as a nucleophilically-bleachable sensitizing dye:

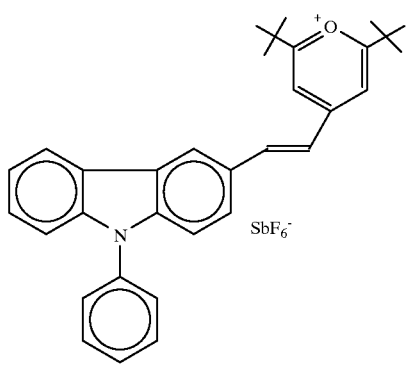

which sensitizes the superacid precursor to green visible radiation. The second color-change layer 24 of the second embodiment is identical to the first color-change layer of the same embodiment, except that the image dye previously described is replaced by the same second image dye as in the second color-change layer of the first embodiment already described above.

The third acid-generating layer 28 of this second embodiment contains the same superacid precursor, secondary acid generator, cosensitizer, fixing reagent and binder as the first and second acid-generating layers 16 and 22 respectively of the same embodiment. However, this third acid-generating layer 28 of this embodiment contains an indicator sensitizing dye of the formula:

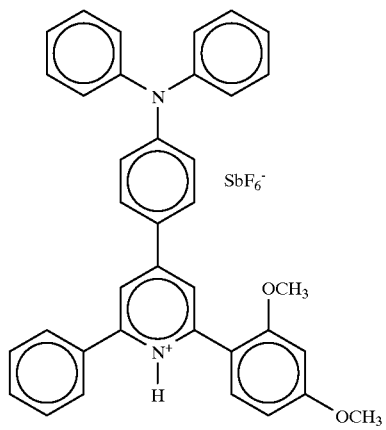

which sensitizes the superacid precursor to blue visible radiation. Superposed on the third acid-generating layer 28 is a third color-change layer 30 which is identical to the first color-change layer, except that the image dye is the free base form of the sensitizing dye used in the third acid-generating layer; this image dye changes from colorless to yellow in the presence of an acid.

The second preferred imaging medium is exposed in a manner very similar to the first one, except that three radiation sources having wavelengths in the red, green and blue visible regions respectively are used. The three radiation sources may be applied simultaneously or sequentially; for example, the medium may be scanned in a raster pattern in any known manner for example (a) simultaneously by the focused beams from three lasers of appropriate wavelengths; (b) sequentially through three masks to radiation from lamps generating radiation of appropriate wavelengths; or (c) simultaneously through a three-color mask to appropriately-filtered radiation from a lamp (thus, this medium is useful for making photographic prints from negatives). The red radiation, which carries the cyan channel of the desired image, images the first acid-generating layer 16, the green radiation, which carries the magenta channel, images the second acid-generating layer 22 and the blue radiation, which carries the yellow channel, images the third acid-generating layer 28. Thus, as described above with reference to FIGS. 1A–1D, since the sensitizing dyes in the three acid-generating layers 16, 22 and 28 are present in their first (i.e., strongly absorbing) form, latent images in superacid are formed in the acid-generating layers 16, 22 and 28.

Passage of the second imaging medium between the heated rollers 12 causes development and fixing of the image in essentially the same way as in the first imaging medium described above, except that color-change layers 18, 24 and 30 form cyan, magenta and yellow images respectively.

The following Examples are now given, though by way of illustration only, to show details of preferred reagents, conditions and techniques for use in the process and medium of the present invention.

EXAMPLES 1–10

Preparation of Sensitizing Dyes

EXAMPLES 1–5

Preparation of Sensitizing Dyes for Deprotonation Processes

Example 1

Preparation of 2,4,6-tris(4-methoxyphenyl) pyridinium hexafluoroantimonate

This Example illustrates the first of the three preferred methods for the preparation of arylpyridinium dyes described above.

Part A: Preparation of 2,4,6-tris(4-methoxyphenyl) pyridine

A mixture of p-anisaldehyde (4.08 g, 30 mmole), p-methoxyacetophenone (9.01 g, 60 mmole) and ammonium acetate (30 g) in acetic acid (75 mL) was stirred at reflux for one hour, then at 20° C. for 16 hours. The precipitate formed was collected by filtration, washed with a 70:30 acetic acid/water mixture, and dried in vacuo to provide 3.50 g (30% yield based upon starting p-methoxyacetophenone) of crude product. Recrystallization from ethanol provided fine colorless matted needles, m. pt. 132–-133.5° C. (Dilthey, J. Pract. Chim. [2], 102, 239 gives the melting point as 133° C.).

Part B: Preparation of hexafluoroantimonate salt

To a solution of 2,4,6-tris(4-methoxyphenyl)pyridine (370 mg, 0.93 mmole, prepared in Part A above) was added aqueous hexafluoroantimonic acid (0.36 mL of 68% aqueous acid mixed with 4.25 mL of water). The resultant solution was stirred, whereupon a bright yellow precipitate formed; this precipitate was filtered off, washed with water (5 mL) and dried in air. The resultant solid was dissolved in acetone (1.5 mL), the solution filtered, and diethyl ether (5mL) was added to give a precipitate, which was collected by filtration, washed with diethyl ether (5 mL) and dried under vacuum to produce the desired salt as fluorescent, bright yellow, fine matted needles (369 mg, 63% yield, melting point 262–263.5° C., $\lambda_{max}$=538 nm (in dichloromethane), $\epsilon$=41,600).

Example 2

Preparation of 2,4,6-tris(2,4-dimethoxyphenyl) pyridine

This Example illustrates the second of the three preferred methods for the preparation of arylpyridinium dyes described above.

A mixture of 2,4-dimethoxybenzaldehyde (1.66 g, 10 mmole), 2,4-dimethoxyacetophenone (3.60 g, 20 mmole) and potassium acetate (10.0 g) in acetic acid (35 mL) was stirred with heating until reflux was reached, then allowed to cool to 20° C. To the resultant yellow-orange solution was added hydroxylamine hydrochloride (1.4 g, 20 mmole). The solution was then stirred at reflux for 1 hour, an additional 5.6 g (80 mmole) of hydroxylamine hydrochloride was added, and the solution was again refluxed for 1 hour. The dark reaction mixture containing suspended solid thus produced was quenched into water (200 mL) and the resultant solution neutralized with potassium hydroxide. The slurry which resulted was extracted with methylene chloride (2×50 mL aliquots) and the organic layer evaporated to a brown oil, which was triturated with methanol (80 mL) to provide a cream-colored solid weighing 1.58 grams. A second crop weighing 0.41 g was obtained by evaporation of the liquors. Total yield of crude product was 1.99 g (42%). Recrystallization from ethyl acetate provided an analytically pure sample, m. pt. 160.5–162° C.

This base can be converted to its hexafluoroantimonate salt in the same manner as described in Example 1, Part B above.

Example 3

Preparation of 2,6-bis(2,4-dimethoxvphenyl)-4-(2-(1,4-dimethoxy)-naphthyl)pyridine This Example illustrates the third of the three preferred methods for the preparation of arylpyridinium dyes described above.

A mixture of 1,4-dimethoxy-2-naphthaldehyde (1.08 g, 5 mmole, prepared as described in N. P. Buu-Hoi and D. Lavit, J. Chem. Soc. 1956, 1743), p-methoxyacetophenone (0.75 g, 5 mmole) and methanesulfonic acid (12 drops) in acetic acid (10 mL) was stirred at reflux for 70 minutes, then cooled to 20° C. Ammonium acetate (4.0 g) and 4-methoxyphenacylpyridinium bromide (1.54 g, 5 mmole) were added and the reaction mixture was refluxed for a further 2 hours. The mixture was then cooled to 20° C. and poured into water. The resultant solution was neutralized with sodium hydroxide, and extracted with methylene chloride (20 mL). The organic layer was washed with water (90 mL) and evaporated to a brown solid which was chromatographed (on silica gel, eluted with methylene chloride) to provide the main fraction as a pale tan solid weighing 1.48 g (62%). Recrystallization from ethyl acetate provided an analytically pure sample as colorless fine matted needles, m. pt. 185.5–186° C.

This base can be converted to its hexafluoroantimonate salt in the same manner as described in Example 1, Part B above.

Example 4

Preparation of 2-[2-[9-ethylcarbazol-3-yl]ethen-1-yl]-1-[2-hydroxyethyl]-3,3-dimethyl-3H-indolium hexafluoroantimonate This Example illustrates the preparation of a sensitizing dye of Formula II above, in which α and δ together form the atoms necessary to complete a benzene ring, η is a $(CH_3)_2C$ grouping, θ is an N—$R^a$ group, in which $R^a$ is a 2-hydroxyethyl grouping, n is 1, Ar is a 3-[N-ethylcarbazolyl] grouping and $\zeta^-$ is a hexafluoroantimonate anion.

Part A : Preparation of 1-[2-hydroxyethyl]-2,3,3-trimethylindolenine bromide 2,3,3-Trimethylindolenine (32 g, 0.2 mole), 2-bromoethanol (31.25 g, 0.25 mole) and finely powdered potassium iodide (250 mg) were placed in a 250 mL round-bottomed flask fitted with a nitrogen bubbler, and the resultant reaction mixture was magnetically stirred and heated on an oil bath at 100–105° C. for 6 hours. (The reaction turned dark red and became thick and viscous after about an hour of heating).

The reaction mixture was then cooled to about 50–60° C. and treated with 50 to 75 mL of ethyl acetate. The mixture was then filtered on a Buchner funnel, and the resultant dark colored solid was washed with dichloromethane until the washings were almost colorless (after five to seven 50 mL aliquots of dichloromethane). The resulting light gray colored crystals were dried in a vacuum oven at approximately 40° C. to give 40 g (71%) of the desired product.

Part B : Preparation of 2-[2-[9-ethylcarbazol-3-yl]ethen-1-yl]-1-[2-hydroxyethyl]-3,3-dimethyl-3H-indolium hexafluoroantimonate 1-[2-Hydroxyethyl]-2,3,3-trimethylindolenine bromide (5.7 g, 20 mmole, prepared in Part A above) and N-ethylcarbazole-3-carboxaldehyde (4.9 g, 21 mmole) were placed in a 500 mL round-bottomed flask fitted with a reflux condenser and a nitrogen gas bubbler. Methanol (approximately 75 mL) was added followed by piperidine (2.5 mL). The resultant reaction mixture was heated to reflux for 18 hours, then cooled to ambient temperature and refrigerated for several hours.

The intermediate product, of the formula:

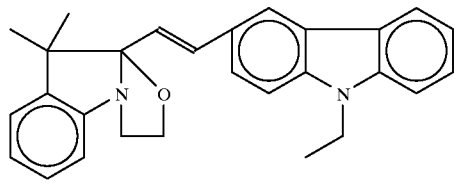

which precipitated during refrigeration was separated by filtration on a Buchner funnel and then washed, on the filter, with ice-cold methanol until the washings were colorless to remove the unreacted bromide starting material and aldehyde (four 25 mL aliquots of methanol). The washed filter cake was dried in a vacuum oven to give 6.55 g (80%) of the off-white product, which was sufficiently pure to be used in the next step.

The combined mother liquor and washings were concentrated to about 25 mL. Piperidine (approximately 0.5 mL) was added and the resultant mixture was refluxed for 20 hours, then cooled to ambient temperature, refrigerated and filtered in the same way as before to give a further 815 mg. (10%) of the cyclic compound, which was also sufficiently pure to be used in the next step.

The intermediate product (6.5 g) was dissolved in dichloromethane (50–60 mL) in a 250 mL round-bottomed flask, and hexafluoroantimonic acid (approximately 30 mL of 50/50 mixture of 68% aqueous acid and water) was added and the resultant mixture was stirred for about 10 min. The mixture was then transferred to a separatory funnel, the organic phase was separated and the aqueous phase was extracted with dichloromethane (25 mL). The organic phases were combined, washed twice with water (two 75 mL aliquots, with the second having a pH between 3.5 and 4.0). The dichloromethane was then removed on a rotary evaporator, and the resultant solid was dried to constant weight in a vacuum oven (4 hours at about 40–45° C.) to give the desired product (10.3 g, a quantitative yield from the metathesis) as a dark-red solid.

Example 5

Preparation of 5-bromo-2-[2-9-ethylcarbazol-3-yl] ethen-1-yl]1-[2-hydroxyethyl]-3,3-dimethyl-3H-indolium hexafluoroantimonate This Example illustrates the preparation of a sensitizing dye of Formula II above, in which a and 6 together form the atoms necessary to complete a benzene ring bearing a bromo substituent at the 5-position of the resultant indolium grouping, η is a $(CH_3)_2C$ grouping, θ is an $N—R^a$ group, in which $R^a$ is a 2-hydroxyethyl grouping, n is 1, Ar is a 3-[N-ethylcarbazolyl] grouping, and $\zeta^-$ is a hexafluoroantimonate anion.

Part A: Preparation of 5-bromo-2,3,3-trimethylindolenine

4-Bromo-phenylhydrazine hydrochloride (8.94 g, 40 mmole) was slurried in absolute ethanol (100 mL) under nitrogen in a 250 mL round-bottomed flask; the salt dissolved exothermically upon the addition of concentrated sulfuric acid (13 mL). 3-Methyl-2-butanone (13 mL, three equivalents) was added to the reaction mixture, which turned a very dark color. The reaction mixture was then refluxed for 2 hours, cooled in an ice bath and water (100 mL) was added. The resultant solution was made basic with concentrated potassium hydroxide solution (12 mL); if any salt precipitated, it was filtered off or more water was added to dissolve the precipitate. The solution was then extracted with dichloromethane and concentrated to a brown oil, which had an $R_f$ of 0.29 under thin layer chromatography using 20% ethyl acetate in hexanes as the eluant.

The oil was filtered through a silica gel plug, eluting with pure dichloromethane, the solvent being discarded up to (and including) the initial yellow color. The silica gel was washed until thin product in atography showed no more product in solution. The dichloromethane solution collected was concentrated to give the desired product (8.64 g; 90.7% yield) as an orange oil, which was used in Part B below without further purification.

Part B : Preparation of 5-bromo-1-[2-hydroxyethyl]-2,3,3-trimethylindolenine

To the orange oil prepared in Part A above (contained in a 50 mL round-bottomed flask) was added 2-bromoethanol (9.086 g, 2 equivalents) and a catalytic amount (several crystals) of sodium iodide. The resultant mixture was then heated at 80° C. under nitrogen overnight. After the overnight heating, the reaction mixture was cooled and filtered, and the resultant solid was rinsed with diethyl ether (1–2 mL), then slurried on the filter with several aliquots of this ether. The filter cake thus produced was rinsed with dichloromethane until no more color could be removed, then dried in a vacuum oven under low heat to give the desired product as a pale brown solid (9.36 g, 71.6% yield).

Part C: Preparation of 5-bromo-2-[2-[9-ethylcarbazol-3-yl]ethen-1-yl]-1-[2-hydroxyethyl]-3,3-dimethyl-3H-indolium hexafluoroantimonate 5-Bromo-1-[2-hydroxyethyl]-2,3,3-trimethylindolenine (2.2146 g, 5.85 mmole, prepared in Part B above) and N-ethylcarbazole-3-carboxaldehyde (1.4379 g, 6.44 mmole, 1.1 equivalents) were dissolved in methanol (10 mL) containing piperidine (1.0 mL, 1.7 equivalents). The resultant mixture was refluxed overnight under nitrogen, whereupon a solid precipitated. The reaction mixture was filtered and washed with cold methanol to give a white solid, which was dissolved in warm dichloromethane (approximately 50 mL) and the resultant solution was transferred to a separatory funnel and washed with hexafluoroantimonic acid (8.90 g of 68% aqueous acid mixed with 2.0 g of water, 3 equivalents of the acid). The dichloromethane solution, which had now turned red, was washed with water to remove any excess acid, and methyl t-butyl ether was added to cause crystallization of the dye, which was separated and dried to give the desired product (3.450 g, 81.4% yield, $\lambda_{max}$=538 nm, $\mu$=60, 200).

EXAMPLES 6–9

Preparation of Sensitizing Dyes for Nucleophile Processes

Example 6

Preparation of 1-methyl-2-[4-diphenylaminophenyl] ethen-1-yl]quinolinium hexafluoroantimonate A mixture of quinaldinium methiodide (713 mg, 2.5 mmole), diphenylbenzaldehyde (683 mg, 2.3 mmole) and acetic anhydride (8 mL) was stirred with heating to reflux for 15 minutes, then cooled to approximately 100° C. and maintained at that temperature for a further 90 minutes. The reaction mixture was then cooled to 20° C., whereupon a small amount of solid precipitated. The reaction mixture was then diluted with acetone (8 mL) and diethyl ether (20 mL) and filtered to provide 665 mg of brick-red prisms. A 600 mg sample of this crude product was chromatographed on silica gel, eluting with a 5% methanol/dichloromethane mixture, to provide 84.5 mg of the desired pure iodide salt as a red-brown amorphous solid. This solid was dissolved in methanol (8 mL) and stirred with 72 mg (0.2 mmole) of silver hexafluoroantimonate dissolved in methanol (0.7 mL). The resulting precipitate was filtered off and the filtrate diluted with a solution of sodium hexafluoroantimonate (0.5 g) in water (30 mL). The precipitate which resulted was filtered off and dried in vacuo at 25° C. overnight to give the desired hexafluoroantimonate salt as brick-red prisms (41 mg), having $\lambda_{max}(CH_2Cl_2)$ 550 nm, $\epsilon$=35,430. A dichloromethane solution of the product was 67% bleached after two minutes and completely bleached within ten minutes by addition of the nucleophilic amine 3-aminopropanol.

Example 7

Preparation of 1,3,3-trimethyl-2-[2-[9-phenylcarbazol-3-yl]ethen-1-yl]3H-indolium hexafluoroantimonate A mixture of freshly-distilled Fischer's base (0.70 g, 4.0 mmole) and N-phenylcarbazole-3-carboxaldehyde (1.08 g, 4.0 mmole) in toluene (3 mL) was heated to approximately 50° C., then phosphorus oxychloride (0.3 mL) was added, resulting in a vigorous (almost violent) exotherm. The resultant mixture was then stirred at ambient temperature for approximately 30 minutes, water (15 mL) was added, and the supernatant was decanted and discarded. The glassy residue remaining was taken up in warm methanol (7 mL) and quenched into water (60 mL) to give a brick-red precipitate, which was collected by filtration, then chromatographed on silica gel, eluting with a 5% methanol/ dichloromethane mixture, followed by a 10% methanol/ dichloromethane mixture. The purest fractions from the chromatography were combined and evaporated to dryness, then the solid residue was taken up in dichloromethane (12 mL) and washed with 10% hexafluoroantimonic acid (2×4 mL aliquots), then with water (6 mL), and finally evaporated to a brittle foam (1.15 g). A 250 mg sample of this foam was recrystallized from chloroform (1.5 mL) to provide the desired pure product (206 mg) as orange-red prisms, having $\lambda_{max}$(CH$_2$Cl$_2$) 512 nm, $\epsilon$=46,170. A dichloromethane solution of the product was completely bleached within one minute by addition of the nucleophilic amine 3-aminopropanol.

Example 8

Preparation of 2,6-di-t-butyl-4-(2-(9-phenylcarbazol-3-yl)ethen-1-yl)pyrylium hexafluoroantimonate Part A: Preparation of 9-phenylcarbazole-3-carboxaldehyde Phosphorus oxychloride (36.0 mL) was added dropwise over a period of 25 minutes to dimethylformamide (37.2 mL) with stirring, the temperature being kept down to about 40° C. by a water bath, and the resultant solution was stirred, with cooling to 30° C., for 30 minutes. At this time, N-phenylcarbazole (9.73 g, 40 mmole) and dichloromethane (10 mL) were added and the reaction mixture was then stirred at 60° C. for 20 hours, then poured into ice-water (600 mL) containing sodium acetate (40 g) and stirred at 20° C. for a further 4 hours. At this time, the pH of the liquid was found to be below 2, so an additional portion of sodium acetate was added to achieve neutrality. The resultant suspension was extracted with dichloromethane (80 mL) and the organic layer passed through a silica gel pad, eluting with additional dichloromethane. The eluant was evaporated to a greenish oil which was triturated with hexanes (50 mL), seeded, and left three hours at 20° C. The desired product was collected by filtration as light gray prisms (9.09 g, 83% yield).

Although the carboxaldehyde thus prepared was sufficiently pure for use in Part B below and in Example 9 below, thin layer chromatography shows that it contains traces of unreacted starting material and a further impurity which appears to be a diformyl derivative. If desired, the product can be further purified by recrystallization from dichloromethane/hexanes to give a material having melting point 103–103.5° C.

Part B

Preparation of 2,6-di-t-butyl-4-(2-(9-phenylcarbazol-3-yl)ethen-1-yl)pyrylium tetrafluoroborate 2,6-Di-t-butyl-4-methylpyrylium tetrafluoroborate (7.2 g, 20 mmole) and N-phenylcarbazole-3-carboxaldehyde (5.7 g., 21 mmole, prepared in Part A above) were placed in a 500 mL round-bottomed flask under a nitrogen atmosphere. Methanol (100 ml) was added and the resultant reaction mixture was stirred at room temperature for 20 hours, then diluted with t-butyl methyl ether (approximately 75 mL) and hexanes (approximately 100 mL) and refrigerated for 4 to 6 hours. The dye which precipitated was vacuum filtered and was washed successively with t-butylmethyl ether (450 mL aliquots) and hexanes (250 mL aliquots) and dried in a vacuum oven.

Part C : Preparation of 2,6-di-t-butyl-4-(2-(9-phenylcarbazol-3-yl)ethen-1-yl)pyrylium hexafluoroantimonate The 2,6-di-t-butyl-4-(2-(9-phenylcarbazol-3-yl)ethen-1-yl)pyrylium tetrafluoroborate prepared in Part B above was dissolved in dichloromethane (approximately 100 mL) in a 500 mL round-bottomed flask, and a solution of fluoroantimonic acid hexahydrate (8 g) in water (75 mL) was added. The resultant two phase mixture was stirred magnetically for about 10 minutes, then transferred to a 500 mL separatory funnel, where the organic phase was separated and the aqueous phase extracted with dichloromethane (25 mL). The organic phases were combined and washed with aqueous fluoroantimonic acid (2 g. of acid in 75 mL of water) and then with water (2 75 mL aliquots). The volume of the resultant organic phase was reduced to approximately 25–30 mL and the phase was then diluted with t-butyl methyl ether (100 mL) and hexanes (50 mL) and the resultant solution refrigerated for 2 to 4 hours. The solid which precipitated during the refrigeration was separated by vacuum filtration, washed on the filter with t-butyl methyl ether (2 25 mL aliquots) and hexanes (50 mL) and then dried in vacuum oven at 40° C. for 6 hours, to give the desired product as a magenta-red crystalline solid (11.3 g, 81% yield based upon the pyrylium salt used in Part B, $\lambda_{max}$=556 nm in dichloromethane, $\epsilon$=7170).

Example 9

Preparation of 6-(but-2-oxy)-2-(1,1-dimethyleth-1-yl)-4-(2-(9-phenylcarbazol-3-yl)ethen-1-yl)benz[b] pyrylium hexafluoroantimonate A mixture of 6-(but-2-oxy)-2-(1,1-dimethyleth-1-yl)-4-methylbenz[b]pyrylium tetrafluoroborate (360 mg, 1.0 mmole, prepared as described in U.S. Pat. No. 5,627,014, Example 63) and 9-phenylcarbazole-3-carboxaldehyde (271 mg, 1.0 mmole, prepared in Example 8, Part A above) in methanol (4 mL) was stirred at 20° C. for 40 minutes, then filtered to isolate a solid which had precipitated. The filter cake was washed with cold methanol (3 mL) and dried under vacuum to produce the tetrafluoroborate analogue of the desired product (569 mg) in the form of a dark ink-blue solid. A sample (210 mg) of this crude tetrafluoroborate salt was taken up in dichloromethane (10 mL) and the resultant solution was washed with two different aqueous sodium hexafluoroantimonate solutions (2 g of salt in 10 mL water, then 1 g of salt in 10 mL water), then with hexafluoroantimonic acid (1.5 mL of the acid hexahydrate in 10 ml of water), and finally with water (15 mL). The washed organic layer was evaporated to approximately 4 mL, diluted with methyl t-butyl ether (6 mL) and filtered to give a cake which was washed with methyl t-butyl ether (15 mL) and dried under vacuum to give the desired hexafluoroantimonate salt as dark blue fine needles (241 mg, 92% yield based upon the tetrafluoroborate salt, $\lambda_{max}$=610 nm in dichloromethane, $\delta$=76600).

EXAMPLES 10–14: Preparation and use of imaging media

The following indicator dyes are used in the Examples below:
Dye A: 2-[2-octyloxyphenyl]-4-[4-dimethylaminophenyl]-6-phenylpyridine (available from Hilton Davis Co.)
Dye B: 2,4,6-tris[4-methoxyphenyl]pyridine (prepared in Example 1 above)
Dye C: 2,4,6-tris[2,4-dimethoxyphenyl]pyridine (prepared in Example 2 above)

Dye D: 2,6-bis[4-methoxyphenyl]-4-[thienyl]pyridine (prepared by the method of Example 1 above)

Dye E: 2,6-bis[4-methoxyphenyl]-4-[4-bromophenyl] pyridine (prepared by the method of Example 1 above)

Dye F: 2,6-bis[4-methoxyphenyl]-4-[2-naphthyl]pyridine (prepared by the method of Example 1 above)

Dye G: 2,4-bis[4-methoxyphenyl]-6-[2-naphthyl]pyridine (prepared by the method of Example 3 above)

Dye H: 2,4,6-tris[2,4,6-trimethoxyphenyl]pyridine (prepared by the method of Example 1 above)

Dye I: 2-[2-[2,4-bis[octyloxy]phenyl]ethen-1-yl]quinoline (available from Yamada Chemical Co., Kyoto Japan)

Dye J: 2-[2-[4-dodecyloxy-3-methoxyphenyl]ethen-1-yl] quinoline (available from Yamada Chemical Co.)

Dye K: 3',6'-bis[N-[2-chlorophenyl]-N-methylamino]spiro [2-butyl-1,1-dioxo[1,2-benzisothiazole- 3(3H),9'-(9H) xanthene]] (prepared by the method of U.S. Pat. No. 4,345,017)

Dye L: 3',6'-bis[N-[2-[methanesulfonyl]phenyl]-N-methylamino]spiro[2-butyl-1,1-dioxo[1,2-benzisothiazole-3(3H),9'-(9H)xanthene]] (prepared by the method of U.S. Pat. No. 4,345,017)

Dye M: 9-diethylamino[spiro[12H-benzo(a)xanthene-12,1' (3'H)isobenzofuran)-3'-one] (available from Hilton Davis Co.)

Dye N: 2'-di(phenylmethyl)amino-6'-[diethylamino]spiro [isobenzofuran-1(3H),9'-(9H)xanthen]-3-one (available from Hilton Davis Co.)

Dye O: 3-[butyl-2-methylindol-3-yl]-3-[1-octyl-2-methylindol-3-yl]-1-(3H)isobenzofuranone (available from Hilton Davis Co.)

Dye P: 6-[dimethylamino]-3,3-bis[4-dimethylamino]-phenyl-(3H)-isobenzofuranone (available from Hilton Davis Co.)

Dye Q: 1-methyl-2-[2-[2,4-bis[octyloxy]phenyl]ethen-1-yl] quinolinium hexafluoroantimonate (available from methylation of Dye I above)

Dye R: 1-methyl-2-[4-diphenylaminophenyl]ethen-1-yl] quinolinium hexafluoroantimonate (prepared in Example 6 above)

Dye S: 1,3,3-trimethyl-2-[2-[9-phenylcarbazol-3-yl]ethen-1-yl]-3H-indolium hexafluoroantimonate (prepared in Example 7 above)

Dye T: 1,3,3-trimethyl-2-[2-[9-ethylcarbazol-3-yl]ethen-1-yl]-3H-indolium hexafluoroantimonate (prepared using a method analogous to that described in Example 7 above)

Dye U: 3',6'-bis[2,3-dihydro-2,3,3-trimethylindol-1-yl]spiro [2-[2-methylprop-1-yl]- 1,1 -dioxo[1,2-benzisothiazole-3 (3H),9'(9H)xanthene]] (prepared in a manner analogous to that described in U.S. Pat. No. 4,345,017)

Dye V: 2-(2,4-dimethoxyphenyl)-4-(4-diphenylamino)-6-phenylpyridinium hexafluoroantimonate Dye W: 2-(2,4-dimethoxyphenyl)-4-(4-diphenylamino)-6-methylpyridinium hexafluoroantimonate Dye X: 4-(9-ethylcarbazol-3-yl)-2,6-bis(4-methoxyphenyl) pyridinium hexafluoroantimonate Dye Y: 2-[2-[9-ethylcarbazol-3-yl]ethen-1-yl]-1-[2-hydroxy-ethyl]-3,3-dimethyl-3H-indolium hexafluoroantimonate (prepared in Example 4 above)

Dye Z: 5-bromo-2-[2-[9-ethylcarbazol-3-yl]ethen-1-yl]-1-[2-hydroxy-ethyl]-3,3-dimethyl-3H-indolium hexafluoroantimonate (prepared in Example 5 above)

Dye AA: 2,6-di-t-butyl-4-(2-(9-phenylcarbazol-3-yl) ethen-1-yl)pyrylium hexafluoroantimonate (prepared in Example 8 above)

Dye BB: 6-(but-2-oxy)-2-(1,1-dimethyleth-1-yl)-4-(2-(9-phenylcarbazol-3-yl)ethen-1-yl)benz[b]pyrylium hexafluoroantimonate (prepared in Example 9 above)

Example 10

This Example illustrates the quantum yields of acid generation which may be achieved using sensitizing dyes in their first forms.

The general method for measurement of quantum yields involved coating the sensitizing dye, a superacid precursor, and optionally a separate indicator dye (to serve as an image dye), in a polymeric binder. In some experiments where the medium was of the protonation type, a non-basic, polycyclic aromatic sensitizer (for example 2-t-butylanthracene) was also present in the film to facilitate generation of an initial amount of acid used to protonate the sensitizing dye when the film is initially exposed to ultra-violet radiation, as described below. The film was then irradiated near the long wavelength absorption maximum of the first form of the sensitizing dye. The absorbance at the wavelength of maximum absorption due to the first form of the sensitizing dye was measured before and after this exposure. From the change in absorption, and measurement of the exposure received by the sample, the quantum yield of acid production could be calculated as described below.

Two separate methods (designated Methods 1 and 2) were used in these experiments depending upon the type of sensitizing dye employed, Method 1 being used mainly for indicator sensitizing dyes, and Method 2 being used mainly for sensitizing dyes in which the first form is converted to the second form by a nucleophile.

Method 1

By way of example, Dye A was tested in the following manner. A coating fluid was prepared from Dye A (5.0 mg), [4-[2-hydroxytetradec-1-yloxy]phenyl]iodonium hexafluoroantimonate (5.0 mg; this superacid precursor was used for all the quantum yield determinations) and 0.5 mL of a 7.5% (w/v) solution of polystyrene (molecular weight 45,000, available from Aldrich Chemical Co., Milwaukee, Wis.) in 2-butanone. This solution was coated onto transparent poly (ethylene terephthalate) film base 4 mil (101 $\mu$m) in thickness (ICI Type 3295, supplied by ICI Americas, Inc., Wilmington, Del.) using a #18 wire-wound coating rod. After drying overnight (under reduced pressure, in the dark, at room temperature), a portion of the film was briefly exposed to ultra-violet radiation from a low-power mercury lamp sufficient to generate enough acid in the film to partially protonate the Dye A (the absorbance achieved at 460 nm was 0.16). The film was then exposed to light at 460 nm (0.48 mW/cm$^2$) for 60 seconds, using the output of a 150W Xenon lamp, which had been spatially homogenized by passing it through about 5–7 m of single core optical fiber, and then passed through a three-cavity interference filter with a bandpass of about 10 nm to select the wavelength. The light intensity at the sample was measured with a calibrated photodiode. After exposure, the absorbance of the film at 456 nm (the wavelength of maximum absorption of protonated Dye A) was measured and found to have increased by 0.205 absorbance units due to acid generation during exposure, which protonated more Dye A. The quantum yield of acid photogeneration under these exposure conditions was 0.13.

In this experiment, the protonated Dye A served as a photosensitizer of the superacid precurs or, and the unprotonated Dye A in the film served as an acid indicator dye, since its increased absorbance at 456 nm upon protonation ($\epsilon^\lambda$=33,000 M$^{-1}$ cm$^{-1}$ is used to quantify the acid formed.

The amount of acid generated ($\Delta$n, in moles) in a given area of the film, is:

$$\Delta n = \frac{a_{ex}\Delta A^\lambda}{10^3 \varepsilon^\lambda}$$

where $a_{ex}$ is the area of the film exposed (in cm$^2$), $\Delta A^\lambda$ is the change in the absorbance of the film at the absorbance maximum of the protonated indicator dye (or, if present, the alternative acid indicator dye), and $\varepsilon^\lambda$ is the molar absorptivity of the protonated sensitizer or indicator dye at that wavelength in L mol$^{-1}$ cm$^{-1}$.

This calculation assumes that every photogenerated proton protonates an unprotonated sensitizing indicator dye or alternative acid indicator dye molecule, which will be the case if (1) the concentration of the sensitizing indicator dye or alternative acid indicator dye is large; (2) the sensitizing dye or alternative acid indicator dye is more basic than other major components of the film; and (3) there is relatively little of any basic impurity in the sample (which would act as a base threshold, to "buffer" the sample). Even if these conditions do not all hold, the calculation can still give valid relative results for similar samples containing, for example, different sensitizing indicator dyes or superacid precursors.

Quantum yields of acid photogeneration ($\Phi_{acid}$) are calculated according to the relation:

$$\Phi_{acid} = \Delta n / \zeta_{abs}$$

where $\zeta_{abs}$ is the number of photons absorbed by the sensitizer, in einsteins (moles of photons). $\zeta_{abs}$ is determined by the relation:

$$\zeta_{abs} = 8.359 \times 10^{-12} [Pt_{ex} \zeta_{ex} a_{ex} (1 - 10^{-A_{av}})] einstein^{-1} nm^{-1} mW^{-1} sec^{-1}$$

where P is the incident (monochromatic or quasi-monochromatic) light power in mW cm$^{-2}$, $t_{ex}$ is the duration of the irradiation in seconds, $\lambda_{ex}$ is the exposure wavelength in nm, and $A_{av}$ is the average (over the exposure period) absorbance of the sample at the exposure wavelength. The term in parentheses is the average absorptance of the sample. In performing the measurement, care must be taken that (1) the area of the film probed by the spectrophotometer light is fully within the exposed area; and (2) that exactly the same area of the film is probed by the spectrophotometer before and after the exposure (because the films which are hand-coated are generally not very uniform in thickness).

Method 2

This method was very similar to Method 1. However, in Method 1, the formation of acid is be measured by conversion of the unprotonated sensitizing dye itself to its protonated form. The nucleophilically-bleachable sensitizing dyes mainly used in Method 2 do not readily undergo protonation, and in any case such protonation would not have a predictable effect on the dye's absorption characteristics. Therefore, a separate acid indicator (image) dye was incorporated into the test film with the sensitizing dye and the superacid precursor, and the change in absorption of this image dye, due to protonation, was used to quantify the amount of acid produced from irradiation of the sensitizing dye. The absorption spectrum of the unprotonated and protonated forms of this image dye were selected so as to overlap minimally with the absorption due to the sensitizer.

Two different indicator dyes were used in these experiments: Dye A and Dye U. Their extinction coefficients were taken to be, respectively, 33,000 M$^{-1}$ cm$^{-1}$ and 98,000 M$^{-1}$ cm$^{-1}$.

By way of Example, Dye Q was tested in the following manner. A coating fluid was prepared from Dye Q (3 mg), the same superacid precursor as in Method 1 above (5 mg), Dye U (5 mg) and the same polystyrene as in Method 1 (0.5 mL of a 7.5% w/v solution in 2-butanone). This coating fluid was coated on to the same transparent film base as described in Method 1. The resulting acid-generating layer was not exposed to ultraviolet light, as in Method 1, but instead was directly exposed at 501 nm. After exposure, the layer was heated at 81° C. for 40 seconds, and the change in absorption due to the image dye, Dye U, was measured at 656 nm. All of the acid produced photochemically was assumed to have protonated Dye U, and therefore the absorption change of the Dye U was used in the calculation described in Method 1 to obtain the quantum yield of acid formation.

In addition to the assumptions mentioned in Method 1, it is also assumed that the image dye is photochemically inert. However, it is likely that these dyes may function to some extent as cosensitizers, and the quantum yield measured in a different system may be different from that quoted here.

The efficiency of the sensitization of superacid precursor decomposition is strongly dependent on the extent of the reaction, with the sensitization yield highest initially and decreasing as the exposure proceeds.

The quantum yields obtained are shown in Table 3 below, which shows whether Method 1 or Method 2 was used, and the specific image dye (if any) employed. In Table 3, $\lambda_U$ denotes the longest absorption wavelength of the second form of the sensitizing dye, $\lambda_1$ denotes the longest absorption wavelength of the first form of this dye, $\lambda_2$ denotes the irradiation wavelength and QY denotes the quantum yield.

TABLE 3

| Dye | Method | Image Dye | Class of dye | $\lambda_U$, nm | $\lambda_1$, nm | $\lambda_2$, nm | QY, % |
|---|---|---|---|---|---|---|---|
| A | 1 | — | Arylpyridine | 334 | 458 | 460 | 6.8 |
| B | 1 | — | Arylpyridine | 330 | 370 | 400 | 7.8 |
| C | 1 | — | Arylpyridine | 320 | 382 | 400 | 11.1 |
| D | 1 | — | Arylpyridine | 340 | 372 | 400 | 4.8 |
| E | 1 | — | Arylpyridine | 332 | 388 | 400 | 7.0 |
| F | 1 | — | Arylpyridine | 332 | 386 | 400 | 5.5 |
| G | 1 | — | Arylpyridine | <320 | 374 | 400 | 6.2 |
| H | 1 | — | Arylpyridine | <320 | 366 | 400 | 3.5 |
| I | 1 | — | Styrylquinoline | 368 | 450 | 460 | 1.9 |
| J | 1 | — | Styrylquinoline | 366 | 438 | 460 | 2.3 |
| K | 1 | — | Xanthene | 358 | 554 | 560 | 0.23 |
| L | 1 | — | Xanthene | 356 | 552 | 544 | 0.13 |
| M | 1 | — | Xanthene | 356 | 528 | 560 | 0.21 |
| N | 1 | — | Fluoran | 380 | 582 | 580 | 0.16 |
| O | 1 | — | Phthalide | 358 | 536 | 544 | 0.18 |
| P | 1 | — | Phthalide | 358 | 616 | 620 | 0.065 |
| Q | 2 | U | Styrylquinoline | — | 450 | 501 | 0.9 |
| R | 2 | A | Styrylquinoline | — | 530 | 544 | 1.4 |
| S | 2 | U | Indole | — | 488 | 501 | 0.65 |
| T | 2 | U | Indole | — | 500 | 501 | 0.53 |
| V | 2 | U | Arylpyridine | — | 456 | 460 | 3.2 |
| W | 1 | — | Arylpyridine | — | 434 | 440 | 5.0 |
| X | 1 | — | Arylpyridine | — | 412 | 440 | 6.6 |
| Y | 2 | A | Indole | — | 500 | 501 | 0.39 |
| Z | 2 | A | Indole | — | 518 | 520 | 0.77 |
| AA | 2 | A | Pyrylium | — | 527 | 520 | 1.31 |
| BB | 2 | A | Benzpyrylium | — | 554 | 560 | 0.43 |

Example 11

This Example illustrates the use of a triarylpyridine indicator sensitizing dye which is coated in its protonated form as the hexafluoroantimonate salt. The protonated indicator dye is used to sensitize an imaging medium of the present invention to near ultra-violet exposure, to produce a final image having, in $D_{max}$ areas, significant absorption in the near ultra-violet and visible regions but, in $D_{min}$ areas, negligible absorption in either the near ultra-violet or visible regions.

Two coating fluids were prepared as follows:

Fluid A

An indicator sensitizing dye (2,4,6-tris[2,4-dimethoxyphenyl]pyridinium hexafluoroantimonate, prepared by washing a dichloromethane solution of Dye C with aqueous hexafluoroantimonic acid, then separating and drying the dichloromethane layer, 10 mg), a superacid precursor ([4-octyloxyphenyl]phenyliodonium hexafluoroantimonate, 20 mg, prepared as described in U.S. Pat. No. 4,992,571), a secondary acid generator (2,2-dimethyl-1-[4-benzyloxybenzyloxalyloxy]prop-3-yl[4-benzyloxybenzyl] oxalate (prepared as described in the aforementioned copending application Ser. No. 08/141,852, 80 mg) and the polystyrene binder as in Example 10 (800 mg of a 20% solution in 2-butanone) were combined together and heated at about 50° C. until complete dissolution of all components had been achieved.

Fluid B

A dispersion was first prepared as follows. A magenta indicator dye (3-[butyl-2-methylindol-3-yl]-3-[1-octyl-2-methylindol-3-yl]-1-(3H)-isobenzofuranone, available from Hilton Davis Co. under the tradename Copikem 35, 1.0 g) and an acrylate polymeric binder (Acryloid B-82, supplied by Rohm and Haas Corporation, Philadelphia, Pa. 19104, 1.25 g) were dissolved in ethyl acetate (10 g), and the resultant solution was added to 7 g of a 2.55% solution of poly(vinyl alcohol) (Vinol 540, available from Air Products Corporation, Allentown, Pa.) in water. The mixture was then sonicated, after which evaporation of ethyl acetate afforded the required dispersion (14.5% solids by weight)

To 1.0 g of this dispersion was added 100 mg of a 20% aqueous solution of potassium acetate and 10 mg of a 5% aqueous solution of a surfactant (Igepal CO-630 (available from GAF Corporation, 1361 Alps Road, Wayne N.J. 07470) to form Fluid B.

Fluid A was coated onto transparent poly(ethylene terephthalate) base 4 mil (101 μm) in thickness (ICI Type 3295, supplied by ICI Americas, Inc., Wilmington, Del.) using a #4 coating rod, to form an acid-generating layer, and the UV/visible absorption spectrum of this coating was measured using a piece of the uncoated film base as the reference. Fluid B was next coated on top of the acid-generating layer using a #3 coating rod, to form a color-change layer.

A portion of imaging medium so produced was exposed to ultraviolet radiation at an exposure of 4.3 mJ/cm² using a nuArc 26-1K Mercury Exposure System (available from nuArc Company, Inc., 6200 West Howard Street, Niles, Ill. 60648; the output of this device was measured using an IL390A "Light Bug" radiometer, available from International Light, Inc., 17 Graf Road, Newburyport, Mass. 01950); after this exposure the entire imaging medium was heated first at 45° C. for 20 seconds and then at 120° C. for 30 seconds. The UV/visible absorption spectrum of the exposed and unexposed regions were then measured, again using a piece of uncoated film base as the reference.

Table 4 below shows the absorbances at one wavelength in the near ultra-violet and one wavelength in the visible region at the various stages of imaging, with uncoated film base as the reference.

TABLE 4

| Absorption wavelength, nm | Acid-generating layer before imaging | Exposed area after heating | Non-exposed area after heating |
|---|---|---|---|
| 366 | 0.312 | 0.468 | 0.023 |
| 544 | 0.005 | 1.105 | 0.004 |

As can be seen in Table 4, the absorbance in the near ultra-violet at 366 nm in the $D_{min}$ region of the imaged film is 0.023, whereas before imaging the absorbance at this wavelength (due to protonated Dye C) was 0.312. On the other hand, in the $D_{max}$ region the absorbance at this wavelength is 0.468, due partly to protonated Dye C and partly to the ultra-violet absorbance of the magenta image dye, whose maximum absorbance is at 544 nm (with an absorbance of 1.105).

Example 12

This Example illustrates the use, in a process of the present invention similar to that described above with reference to Table 1, of a styryl quinoline indicator sensitizer dye which is coated in its unprotonated form. A non-basic, polycyclic aromatic sensitizer which absorbs significantly only below 370 nm (in the near ultra-violet) is also coated. The protonated form of the indicator sensitizer dye absorbs in the blue visible region. The protonated form of the image dye used absorbs in the green region of the visible spectrum. The imaging medium used is first blanket exposed to near ultra-violet radiation, generating acid from the nonbasic polycyclic aromatic sensitizer and the superacid precursor which protonates the indicator sensitizing dye. The medium is then imagewise exposed to blue light, which is absorbed by the protonated form of the indicator sensitizing dye. After heating, a final image having significant absorption in the green region of the spectrum in $D_{max}$ areas but negligible absorption in either the blue or green regions of the spectrum in $D_{min}$ areas is obtained.

Two coating fluids were prepared as follows:

Fluid A

Indicator sensitizing dye Dye I (1.5 mg), a non-basic polycyclic aromatic sensitizer 1-[prop-1-enyl]pyrene (10 mg), a secondary acid generator 1-[4-benzyloxybenzyloxalyloxy]oct-2-yl[4-benzyloxybenzyl] oxalate (prepared according to the methods described in the aforementioned copending application Ser. No. 08/141,852, 60 mg) and the same superacid precursor (15 mg) and polystyrene binder (600 mg of a 20% solution in 2-butanone) as in Example 11 above were combined and heated at about 50° C. until complete dissolution of all components had been achieved.

Fluid B

To 1.0 g of the dispersion prepared by the method described in Example 11 above (17% solids) was added 100 mg of a 2% aqueous solution of potassium acetate and 50 mg of a 5% aqueous solution of surfactant Igepal CO-630.

Fluid A was coated onto reflective Melinex base 4 mil (101 μm) in thickness using a #4 coating rod, to form an acid-generating layer. Fluid B was coated on top of this layer using a #3 coating rod, to form a color-change layer.

The entire imaging medium so produced was exposed to ultraviolet radiation using 4.5 "Units" of exposure from the same nuArc apparatus as in Example 11 above filtered through a U360 colored-glass bandpass filter (available from Hoya Corporation, Fremont, Calif.). The exposure received by the film was measured as 7.6 mJ/cm² using the same radiometer as in Example 11 above. After this exposure, a portion of the imaging medium was exposed to filtered radiation for various lengths of time from a 150W Xenon lamp, using the apparatus described in Example 10 above with a three-cavity interference filter having a bandpass of about 10 nm centered at 440 nm. After this Xenon lamp exposure, the whole imaging medium was heated first at 45° C. for 20 seconds and then at 120° C. for 30 seconds. The blue and green reflection optical densities were measured at each stage of this process using an X-Rite 310 photographic densitometer, supplied by X-Rite, Inc., Grandville, Mich., equipped with the appropriate filter. The results obtained are shown in Table 5 below.

TABLE 5

| Exposure at 360 nm (mJ/cm²) | Exposure at 440 nm (mJ/cm²) | Heating time, sec. at 45° C. (90° C.) | Blue OD (reflection) | Green OD (reflection) |
|---|---|---|---|---|
| 0 | 0 | 0 (0) | 0.06 | 0.04 |
| 7.6 | 0 | 0 (0) | 0.21 | 0.04 |
| 7.6 | 0 | 20 (30) | 0.07 | 0.10 |
| 7.6 | 40 | 20 (30) | 0.38 | 0.79 |
| 7.6 | 60 | 20 (30) | 0.49 | 1.86 |
| 7.6 | 80 | 20 (30) | 0.63 | 2.59 |

As can be seen from Table 5, after exposure at 360 nm the optical density in the blue region was 0.21, meaning that about 38% of incident blue light was absorbed by protonated Dye I. The imaging medium could then be imaged using blue light to give a green $D_{max}$ of 2.59 by protonation of the image dye. However, $D_{min}$ regions of the imaged film exhibited optical density in the blue region of only 0.07, showing that Dye I had been returned to the unprotonated form in which it was originally coated (when it gave a blue optical density of 0.06).

Example 13

This Example illustrates the use of a xanthene indicator sensitizing dye which is coated in its unprotonated form. A non-basic, polycyclic aromatic sensitizer which absorbs significantly only below 370 nm (in the near ultra-violet) is also coated. The protonated form of the indicator sensitizing dye absorbs in the green visible region, while the protonated form of the image dye used also absorbs in the green region of the spectrum. The imaging medium is first blanket exposed to near ultra-violet radiation, generating acid from the polycyclic aromatic sensitizer and the superacid precursor and protonating the indicator sensitizing dye. The medium is then imagewise exposed to green light, which is absorbed by the protonated form of the indicator sensitizing dye. After heating, a final image having significant absorption in the green region of the spectrum in $D_{max}$ areas but negligible absorption in the green region of the spectrum in $D_{min}$ areas is obtained.

Two coating fluids were prepared as follows:

Fluid A

Indicator sensitizing dye Dye K (2.4 mg), a non-basic polycyclic aromatic sensitizer (1-[prop-1-enyl]pyrene, 15 mg), and the same superacid precursor (30 mg), secondary acid generator (120 mg) and polystyrene binder (1.2 g of a 20% solution in 2-butanone) as in Example 11 above were combined and heated at about 50° C. until complete dissolution of all components had been achieved. The same Fluid B as in Example 12 above was used.

Fluid A was coated onto reflective Melinex base 4 mil (101 μm) in thickness using a #4 coating rod, to form an acid-generating layer. Fluid B was coated on top of this layer using a #3 coating rod, to form a color-change layer.

The entire imaging medium so produced was exposed to ultraviolet radiation in the same way as in Example 12 above using 3 "Units" of exposure. The exposure received by the film under these conditions was measured (using the same radiometer as in Example 11) to be 4.1 mJ/cm². After this exposure, a portion of the imaging medium was exposed to filtered radiation for various lengths of time from a 150W Xenon lamp, using the apparatus described in Example 10 above with a three-cavity interference filter having a bandpass of about 10 nm centered at 560 nm. After this exposure, the whole imaging medium was heated first at 45° C. for 20 seconds and then at 120° C. for 30 seconds. The green reflection optical density was measured at each stage of this process using the same densitometer as in Example 12. The results obtained are shown in Table 6 below

TABLE 6

| Exposure at 360 nm (mJ/cm²) | Exposure at 560 nm (mJ/cm²) | Heating time, sec. at 45° C. (90° C.) | Green OD (reflection) |
|---|---|---|---|
| 0 | 0 | 0 (0) | 0.06 |
| 4.1 | 0 | 0 (0) | 0.34 |
| 4.1 | 0 | 20 (30) | 0.09 |
| 4.1 | 270 | 20 (30) | 0.93 |
| 4.1 | 540 | 20 (30) | 2.48 |

As can be seen from Table 6, after exposure at 360 nm the optical density in the green region was 0.34, meaning that about 54% of incident green light was absorbed by protonated Dye K. The imaging medium could then be imaged using green light to give a green $D_{max}$ of 2.59 by protonation of the image dye. However, $D_{min}$ regions of the imaged film exhibited optical density in the green region of only 0.09, showing that Dye K had been substantially returned to the unprotonated form in which it was originally coated (when it gave a green optical density of 0.06).

Example 14

This Example illustrates the use of a sensitizing dye (Dye S), with and without added cosensitizer, to form an image by a nucleophile process of the present invention. The color-change layer used in this Example contains a nucleophilic primary amine base, which decolorizes the sensitizing dye when the film is heated after imaging.

A stock solution was prepared by dissolving the same superacid precursor as in Example 10 above (40 mg), the same secondary acid generator as in Example 12 above (120 mg) and Dye S (20 mg) in a solution of the same polystyrene as in Example 10 (4 g of a 10% w/w solution in 2-butanone). Coating fluids A–F were prepared by adding, to 400 mg of this stock solution, the following various cosensitizers:

Fluid A No cosensitizer (control)
Fluid B 5 mg triphenylamine
Fluid C 9.6 mg tris(p-bromophenyl)amine
Fluid D 5.4 mg N-(p-methoxyphenyl)carbazole
Fluid E 4.8 mg N-phenylcarbazole
Fluid F 4.4 mg 2,5-di-t-butylhydroquinone.

These amounts of cosensitizers were chosen so that the molar ratio of cosensitizer to superacid precursor in the coating solutions was approximately 3.7.

Coating fluids A-F were coated on to reflective Melinex film base of 5 mil (126 μm) thickness using a #8 coating rod to form an acid-generating layer. The resultant films were overcoated to form a color-change layer using a #12 coating rod with a dispersion prepared as follows.

The same Copikem 35 indicator dye as in Example 11 above (2.5 g) and an amine base (1-(3-aminoprop-1-yl) imidazole, 0.275 g) were added to a solution of the same Acryloid B-82 binder as in Example 11 (7.5 g in 40 g of ethyl acetate), and the resultant solution was added to a solution of the same Vinol 540 as used in Example 11 (28.6 g of a 7% solution in water). Water (55 g) was added, and the resultant mixture was sonicated. Evaporation of ethyl acetate afforded the required aqueous dispersion (61.2 g, 16.9% solids by weight).

The resultant imaging media were exposed to light at 501 nm (0.93 mW/cm$^2$ exposure) through a transmission step wedge for 1800 seconds. After exposure, the films were heated at 60° C. for 30 seconds, then at 120° C. for 40 seconds. Optical densities (green) were recorded in $D_{min}$ (non-exposed) and $D_{max}$ (exposed) areas using the same densitometer as in Example 12 with the appropriate filter (Status A). Table 8 shows optical densities before imaging and after exposure and heating, the minimum exposure required to attain $D_{max}$, and the oxidation potential of the cosensitizer (measured in acetonitrile solution against a standard calomel electrode).

TABLE 8

| Medium | OD before imaging | $D_{max}$ after imaging | $D_{min}$ after imaging | Energy to $D_{max}$ (mJ/cm$^2$) | Oxidation Potential (mV) |
|---|---|---|---|---|---|
| A | 0.7 | — | 0.10 | >1674 | 1410* |
| B | 0.71 | 0.65 | 0.08 | 15.9 | 956 |
| C | 0.69 | 0.69 | 0.10 | 82 | 1109 |
| D | 0.72 | 0.64 | 0.09 | 293 | 1260 |
| E | 0.70 | — | 0.10 | >1674 | 1312 |
| F | 0.74 | 0.68 | 0.10 | 293 | Unknown |

*Since no cosensitizer was added, the oxidation potential quoted is that of the sensitizing dye itself.

From the data in Table 8, it will be seen that in all cases the sensitizing dye was bleached after imaging, as shown by a drop in optical density from about 0.7 before heating to about 0.1 after heating. The sensitivity of the medium, as measured by the energy required to reach $D_{max}$ was highly dependent upon the cosensitizer used; without a cosensitizer, the medium could not be imaged at all with less than 1674 mJ/cm$^2$ exposure, whereas with triphenylamine as cosensitizer, $D_{max}$ was attained at an exposure of 15.9 mJ/cm$^2$. Furthermore, the effectiveness of a cosensitizer was inversely related to its oxidation potential From the foregoing, it will be seen that the present invention provides an imaging medium, and a process for producing an image, which overcomes the limitations of the '489 and '612 processes. In particular, the present invention allows imagewise exposure to be effected using radiation in the same wavelength range as that in which the image is to be viewed, and also enables an image to be produced in which the $D_{min}$ regions do not exhibit the absorption of the sensitizing dye used in the imaging process. Also, certain processes of the present invention can produce a full color image using imagewise exposures at only one wavelength, with blanket exposures at two further wavelengths.

We claim:
1. A process for producing an image, which process comprises:
providing an imaging medium comprising an acid-generating layer or phase, said acid-generating layer or phase comprising a mixture of a superacid precursor, a sensitizing dye and a secondary acid generator, and a color-change layer or phase comprising an image dye;

the sensitizing dye having a first form and a second form, the first form having substantially greater substantial absorption in a first wavelength range than the second form;

the superacid precursor not being capable, in the absence of the first form of the sensitizing dye, of being decomposed to produce superacid by actinic radiation in the first wavelength range;

the secondary acid generator being capable of thermal decomposition to form a secondary acid, the thermal decomposition of the secondary acid generator being catalyzed by superacid; and the image dye undergoing a change in its absorption of radiation upon contact with the secondary acid;

while at least part of the sensitizing dye is in its first form, imagewise exposing the medium to actinic radiation in the first wavelength range, thereby causing, in the exposed areas of the acid-generating layer or phase, the sensitizing dye to decompose at least part of the superacid precursor, with formation of superacid;

thereafter, heating the medium to cause, in the exposed areas of the acid-generating layer or phase, acid-catalyzed thermal decomposition of the secondary acid generator and formation of the secondary acid;

admixing the components of the acid-generating and color-change layers or phases, thereby causing, in the exposed areas of the medium, the secondary acid to bring about the change in absorption of the image dye and thereby form the image; and in the non-exposed areas of the medium, converting the sensitizing dye to its second form.

2. A process according to claim 1 wherein the conversion of the sensitizing dye to its second form is effected by contacting the sensitizing dye with a base.

3. A process according to claim 1 wherein the conversion of the sensitizing dye to its second form is effected by an essentially irreversible chemical change in the sensitizing dye.

4. A process according to claim 3 wherein the chemical change is caused by the reaction of a nucleophile with the sensitizing dye.

5. A process according to claim 4 wherein the nucleophile is a primary or secondary amine.

6. A process according to claim 4 wherein the sensitizing dye is of the formulae:

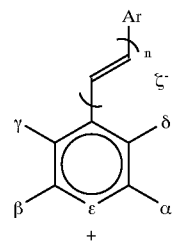

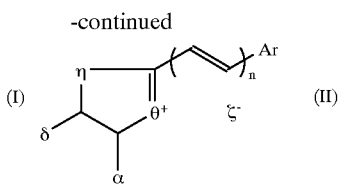

wherein:
- α and δ are each a hydrogen atom or an organic group in which a carbon atom is directly bonded to the ring carrying the groups α and δ, or α and δ together comprise the atoms necessary to complete a substituted or unsubstituted benzene ring;
- β and γ are each a hydrogen atom or an organic group in which a carbon atom is directly bonded to the ring carrying the groups β and γ, or β and γ together comprise the atoms necessary to complete a substituted or unsubstituted benzene ring;
- ε is a oxygen, sulfur or selenium atom, or is an N—$R^a$ group, in which $R^a$ is a hydrogen atom, an alkyl group containing from about 1 to about 20 carbon atoms, or an aryl group;
- ζ is an anion;
- η is a $CR^cR^d$ group, a $CR^c$=$CR^d$ group, an oxygen or sulfur atom, or an N—$R^b$ group;
- θ is an oxygen, sulfur or selenium atom, or is an N—$R^a$ group;
- $R^a$ is a hydrogen atom, an alkyl group containing from about 1 to about 20 carbon atoms, and optionally bearing a protonated heteroatom substituent, or an aryl group;
- $R^b$ is an alkyl group containing from about 1 to about 20 carbon atoms, or an aryl group;
- $R^c$ and $R^d$ are each independently a hydrogen atom, an alkyl group containing from about 1 to about 20 carbon atoms or an aryl group;
- n is 0, 1, 2 or 3; and
- Ar is an aryl or heterocyclyl group.

7. A process according to claim 6 wherein the sensitizing dye is any one or more of:
2,4,6-tris(4-methoxyphenyl)pyridine;
2,6-bis(4-methoxyphenyl)-4-(2-thienyl)pyridine;
2,6-bis(4-methoxyphenyl)-4-(2-(4-bromophenyl)pyridine;
2,6-bis(4-methoxyphenyl)-4-(2-naphthyl)pyridine;
2,4-bis(4-methoxyphenyl)-6-(2-naphthyl)pyridine;
2,4,6-tris(2,4,6-trimethoxyphenyl)pyridine; and
2,6-bis(4-methoxyphenyl)-4-(2-(1,4-dimethoxy)naphthyl)pyridine; and
2,4,6-tris(2,4-dimethoxyphenyl)pyridine.

8. A process according to claim 6 wherein the sensitizing dye is any one or more of:
2-(2,4-dimethoxyphenyl)-4-(4-diphenylamino)-6-phenylpyridine;
2-(2,4-dimethoxyphenyl)-4-(4-diphenylamino)-6-methylpyridine; and
4-(9-ethylcarbazol-3-yl)-2,6-bis(4-methoxyphenyl)pyridine.

9. A process according to claim 6 wherein the sensitizing dye is any one or more of:
1-Methyl-2-[2-[2,4-bis[octyloxy]phenyl]ethen-1-yl]quinolinium hexafluoroantimonate;
1-Methyl-2-[4-diphenylaminophenyl]ethen-1-yl]quinolinium hexafluoroantimonate;
1,3,3-Trimethyl-2-[2-[9-phenylcarbazol-3-yl]ethen-1-yl]-3H-indolium hexafluoroantimonate; and
1,3,3-Trimethyl-2-[2-[9-ethylcarbazol-3-yl]ethen-1-yl]-3H-indolium hexafluoroantimonate.

10. A process according to claim 6 wherein the sensitizing dye is any one or more of:
2-[2-[9-ethylcarbazol-3-yl]ethen-1-yl]-1-[2-hydroxyethyl]-3,3-dimethyl-3H-indolium hexafluoroantimonate;
5-bromo-2-[2-[9-ethylcarbazol-3-yl]ethen-1-yl]-1-[2-hydroxyethyl]3,3-dimethyl-3H-indolium hexafluoroantimonate;
2,6-di-t-butyl-4-(2-(9-phenylcarbazol-3-yl)ethen-1-yl)pyrylium hexafluoroantimonate; and
6-(but-2-oxy)-2-(1,1-dimethyleth-1-yl)-4-(2-(9-phenylcarbazol-3-yl)ethen-1-yl)benz[b]pyrylium hexafluoroantimonate.

11. A process according to claim I wherein there is present in admixture with the sensitizing dye a cosensitizer which:
(a) has an oxidation potential of from about 700 to about 1000 mV relative to a standard calomel electrode; and
(b) is not more basic than the secondary acid generator.

12. A process according to claim 11 wherein the cosensitizer is a triarylamine or a hydroquinone.

13. A process according to claim 12 wherein the cosensitizer comprises a triphenylamine in which one of the phenyl nuclei bears a para hydroxyalkyl, alkoxyalkyl or α-alkenyl group, or in which one of the phenyl nuclei bears no para substituent but bears a meta substituent selected from the group consisting of alkoxy, aryloxy, arylamino and alkyl groups.

14. A process according to claim 3 wherein the chemical change is a thermal decomposition of the sensitizing dye.

15. A process according to claim 1 wherein a reagent capable of converting the first form of the sensitizing dye to its second form is present in the color-change layer or phase of the imaging medium, so that so that the mixing of the components of the acid-generating and color-change layers or phases introduces the reagent into the non-exposed areas of the medium and converts the sensitizing dye to its second form.

16. A process according to claim I wherein a reagent capable of converting the first form of the sensitizing dye to its second form is present in a third layer interposed between the acid-generating layer and the color-change layer, and wherein the first, second and third layers are all mixed to form the image.

17. A process according to claim 1 wherein the imagewise exposure, the heating step, the admixture of the components and the conversion of the sensitizing dye to its second form are all carried out in an essentially anhydrous medium.

18. A process according to claim 1 wherein the acid-generating and color-change layers or phases each comprise a polymeric binder.

19. A process according to claim 1 wherein the sensitizing dye is originally present in the medium in its second form but, prior to the imagewise exposure, the whole imaging medium is treated so as to convert at least part of the sensitizing dye to its first form.

20. A process according to claim 1 wherein the first form of the sensitizing dye has substantial absorption in the wavelength range of about 400 to about 900 nm, but the second form has substantial absorption only below about 400 nm, the difference between the wavelengths of maximum absorption of the first and second forms of the sensitizing dye being at least about 50 nm.

21. A process according to claim 18 wherein the imagewise exposure is conducted with visible radiation, and the image is visible to the human eye.

22. A process according to claim 1 wherein the first form of the sensitizing dye has substantial absorption in the wavelength range of about 330 to about 450 nm, but the second form has substantial absorption only below about 350 nm, the difference between the wavelengths of maximum absorption of the first and second forms of the sensitizing dye being at least about 50 nm.

23. A process according to claim 22 wherein the imagewise exposure is conducted with ultra-violet radiation, and the image has the form of an ultra-violet photomask.

24. A process according to claim 1 wherein the superacid precursor comprises an iodonium compound.

25. A process according to claim 24 wherein the superacid precursor comprises a diaryliodonium compound.

26. A process according to claim 1 wherein the secondary acid generator is an oxalate or a 3,4-disubstituted-cyclobut-3-ene-1,2-dione in which at least one of the 3- and 4-substituents consists of an oxygen atom bonded to the squaric acid ring, and an alkyl or alkylene group, a partially hydrogenated aryl or arylene group, or an aralkyl group bonded to said oxygen atom, said 3,4-disubstituted-cyclobut-3-ene-1,2-dione being capable of decomposing so as to cause replacement of the or each original alkoxy, alkyleneoxy, aryloxy, aryleneoxy or aralkyloxy group of the derivative with a hydroxyl group, thereby producing squaric acid or an acidic squaric acid derivative having one hydroxyl group.

27. A process according to claim 26 wherein the 3,4-disubstituted-cyclobut-3-ene-1,2-dione is selected from the group consisting of:
(a) primary and secondary esters of squaric acid in which the α-carbon atom bears a non-basic cation-stabilizing group;
(b) tertiary esters of squaric acid in which the α-carbon atom does not have an sp² or sp hybridized carbon atom directly bonded thereto; and
(c) tertiary esters of squaric acid in which the α-carbon atom does have an sp² or sp hybridized carbon atom directly bonded thereto, provided that this sp² or sp hybridized carbon atom, or at least one of these sp² or sp hybridized carbon atoms, if more than one such atom is bonded directly to the α-carbon atom, is conjugated with an electron-withdrawing group.

28. A process according to claim 26 wherein the 3,4-disubstituted-cyclobut-3-ene-1,2-dione is of one of the following formulae:

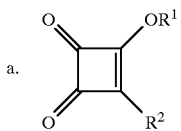

in which $R^1$ is an alkyl group, a partially hydrogenated aromatic group, or an aralkyl group, and $R^2$ is a hydrogen atom or an alkyl, cycloalkyl, aralkyl, aryl, amino, acylamino, alkylamino, dialkylamino, alkylthio, alkylseleno, dialkylphosphino, dialkylphosphoxy or trialkylsilyl group, subject to the proviso that either or both of the groups $R^1$ and $R^2$ may be attached to a polymer;

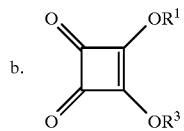

in which $R^1$ and $R^3$ independently are each an alkyl group, a partially hydrogenated aryl group or an aralkyl group, subject to the proviso that either or both of the groups $R^1$ and $R^3$ may be attached to a polymer; and

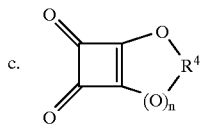

in which n is 0 or 1, and $R^4$ is an alkylene group or a partially hydrogenated arylene group;

or the squaric acid derivative comprises at least one unit of the formula:

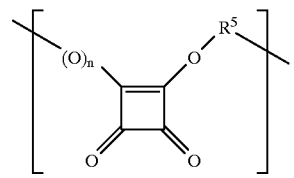

in which n is 0 or 1, and $R^5$ is an alkylene or partially hydrogenated arylene group.

29. A process according to claim 26 wherein the oxalate is selected from the group consisting of:
(a) primary and secondary esters of oxalic acid in which the α-carbon atom bears a non-basic cation-stabilizing group;
(b) tertiary esters of oxalic acid in which the α-carbon atom does not have an sp² or sp hybridized carbon atom directly bonded thereto;
(c) tertiary esters of oxalic acid in which the α-carbon atom does have an sp² or sp hybridized carbon atom directly bonded thereto, provided that this sp² 2 or sp hybridized carbon atom, or at least one of these sp² or sp hybridized carbon atoms, if more than one such atom is bonded directly to the α-carbon atom, is conjugated with an electron-withdrawing group;
(d) an ester formed by condensation of two moles of an alcohol with the bis(hemioxalate) of a diol, provided that the ester contains at least one ester grouping of type (a), (b) or (c);
(e) polymeric oxalates derived from polymerization of oxalate esters having an ethylenically unsaturated group, provided that the ester contains at least one ester grouping of type (a), (b) or (c); and
(f) condensation polymers of oxalates, provided that the ester contains at least one ester grouping of type (a), (b) or (c) above.

* * * * *